United States Patent
Hibino et al.

(10) Patent No.: US 7,050,016 B2
(45) Date of Patent: May 23, 2006

(54) MATCHING UNIT AND RECEIVER APPARATUS USING THE SAME

(75) Inventors: Yasuhiro Hibino, Ibi-gun (JP); Ryuichi Kamimoto, Nisshin (JP); Akira Ito, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/526,314

(22) PCT Filed: Aug. 2, 2004

(86) PCT No.: PCT/JP2004/011393
§ 371 (c)(1),
(2), (4) Date: Mar. 2, 2005

(87) PCT Pub. No.: WO2005/015758
PCT Pub. Date: Feb. 17, 2005

(65) Prior Publication Data
US 2005/0264466 A1 Dec. 1, 2005

(30) Foreign Application Priority Data
Aug. 7, 2003 (JP) ............................ 2003-288724

(51) Int. Cl.
*H01Q 1/50* (2006.01)
(52) U.S. Cl. .................. 343/860; 343/850; 333/32
(58) Field of Classification Search ........... 343/850, 343/860; 333/17.3, 32
See application file for complete search history.

(56) References Cited

U.S. PATENT DOCUMENTS

| | | | | |
|---|---|---|---|---|
| 5,239,302 A * | 8/1993 | Maeda et al. | ............... | 343/704 |
| 5,699,071 A * | 12/1997 | Urakami et al. | ........... | 343/713 |
| 5,999,135 A * | 12/1999 | Nozaki et al. | ............... | 343/713 |
| 6,201,505 B1 * | 3/2001 | Terashima et al. | .......... | 343/713 |
| 6,765,540 B1 * | 7/2004 | Toncich | ...................... | 343/860 |
| 6,970,140 B1 * | 11/2005 | Hibino et al. | ............... | 343/860 |
| 2002/0118075 A1 * | 8/2002 | Ohwada et al. | ............... | 333/32 |
| 2004/0207565 A1 * | 10/2004 | Hibino et al. | ............... | 343/860 |

FOREIGN PATENT DOCUMENTS

| | | |
|---|---|---|
| JP | 52-111507 | 8/1977 |
| JP | 59-140552 | 9/1984 |
| JP | 06-112857 | 4/1994 |

(Continued)

*Primary Examiner*—Tan Ho
(74) *Attorney, Agent, or Firm*—Steptoe & Johnson LLP

(57) ABSTRACT

A matching device causes an antenna to match a receiving section arranged to receive a signal in a first frequency band and a signal in a second frequency band lower than the first frequency band. The matching device includes a first terminal arranged to be connected to the antenna, a first inductor connected between the first terminal and a first node, a second inductor connected between the first node and a ground, a first capacitor connected between the first node and a second node, a second terminal arranged to be connected to the receiving section, the second terminal being connected to the second node, and a third inductor connected between the second node and the ground. The second inductor has a capacitive impedance in the first frequency band, and has an inductive impedance in the second frequency band. This matching device can supply a signal in the second frequency band received by the antenna to the receiving section with a small loss. The antenna having a small length can receive a signal of low frequencies and long wavelengths in the second frequency band.

33 Claims, 12 Drawing Sheets

FOREIGN PATENT DOCUMENTS

| | | |
|---|---|---|
| JP | 07-162251 | 6/1995 |
| JP | 09-130285 | 5/1997 |
| JP | 10-126220 | 5/1998 |
| JP | 2001-526483 A | 12/2001 |
| JP | 2002-9505 | 1/2002 |
| JP | 2002-064401 | 2/2002 |
| JP | 2002-208875 | 7/2002 |
| JP | 2003-188952 | 7/2003 |
| JP | 2003-198309 | 7/2003 |
| WO | WO00/13315 | 3/2000 |

* cited by examiner

PRIOR ART

MATCHING UNIT AND RECEIVER APPARATUS USING THE SAME

This application is a 371 PCT/JP04/11393 filed on Aug. 02, 2004

TECHNICAL FIELD

The present invention relates to a matching device enabling a smal antenna to receive high-frequency signals, and to a receiver including the matching device.

BACKGROUND ART

Portable communication devices, such as mobile phones, have been recently expected to have multifunction. Particularly according to start of terrestrial digital broadcasting creates new demand for watching television (TV) broadcasts on mobile phones. Japanese Patent Laid-Open Publication No. 2001-526483 and Japanese Patent Laid-Open Publication No. 2003-188952 disclose such multifunctional communication devices.

A conventional portable receiver will be described below. FIG. 22 is a block diagram of the conventional portable receiver.

Antenna 1 for a mobile phone receives a mobile-phone signal, a high frequency signal of about 850 MHz. Antenna 1 has a length of about ¼ wavelengths (about 70 mm) of the signal so as to have an impedance of 50 Ω at the frequency of the signal.

An output of antenna 1 is connected to transmitting/receiving section 2 outputting digital audio data obtained by demodulating the received mobile-phone. An output of transmitting/receiving section 2 is connected to signal processor 3 for converting the digital audio data output from transmitting/receiving section 2 into an analog audio signal and outputting the signal to audio output unit 4.

Rod antenna 5 for receiving TV signals is extendable to have a variable length so as to receive high frequency signals ranging from about 50 MHz, the lower limit frequency in a VHF broadcast band, to about 770 MHz, an upper limit frequency of the UHF broadcast band. Having the length adjusted to about ¼ wavelengths of a signal to be received, antenna 5 can receive TV broadcasts. Rod antenna 5, upon being extended, needs to have a length greater than about 100 cm in order to receive a signal of about 50 MHz, a lower limit frequency in the VHF broadcast band.

An output of rod antenna 5 is connected to input terminal 6 of matching unit 7. Output terminal 8 of matching unit 7 outputs a signal in a broadcast band (frequency band) containing a signal of a channel to be received. Electronic tuner 9 for TV reception provided between output terminal 8 and signal processor 3 selects a signals to be received in the broadcast band, demodulates the signal to be received, and outputs the demodulated signal to signal processor 3.

Signal processor 3 performs a signal processing, such as a demodulating process or an error correction process, for the demodulated signal so as to convert the demodulated signal into an analog audio signal 1 and an analog video signal. The analog audio signal is output as audio from audio output unit 4, while the analog video signal is output as an image to display 10.

Matching unit 7 will be described in detail below. Matching device 7 includes series assembly 13 having first switch 11 and low-pass filter 12, series assembly 16 having second switch 14 and band-pass filter 15, and series assembly 19 having third switch 17 and high-pass filter 18. Series assemblies 13, 16 and 19 are connected in parallel with each other.

A cut-off frequency of low-pass filter 12 is the highest frequency of channels in a VHF low band (90 MHz to 108 MHz in Japan, 55 MHz to 88 MHz in the U.S.). Band-pass filter 15 allows signals in a VHF high band (170 MHz to 222 MHz in Japan, 170 MHz to 216 MHz in the U.S.) to pass through it, and blocks signals of the other frequencies. A cut-off frequency of high-pass filter 18 is the lowest frequency of channels in a UHF band (470 MHz to 770 MHz in Japan, 470 MHz to 806 MHz in the U.S.).

In matching device 7, if a signal of a channel in the VHF low band is received, first switch 11 is exclusively turned on. This operation allows the signal to be supplied to low-pass filter 12, thus attenuating signals of frequencies higher than frequencies in the VHF low band. If a signal of a channel in the VHF high band is received, second switch 14 is exclusively turned on. This operation allows the signal to be supplied to band-pass filter 15, thus attenuating signals of frequencies other than frequencies in the VHF high band. If a signal of a channel in the UHF band is received, third switch 17 is exclusively turned on. This operation allows the signal to be supplied to high-pass filter 18, thus attenuating signals of frequencies other than the frequencies in the UHF band. Filters 12, 15 and 18 have a function to match impedances between rod antenna 5 and electronic tuner 9 for the signals of the frequencies supplied to the tuner.

Transmitting/receiving section 2 is required to be always ready to receive a signal input from antenna 1 so as to detect a mobile-phone signal whenever the phone signal is input. Transmitting/receiving section 2 transmits a signal periodically to a nearest base station (not illustrated) via antenna 1. Therefore, regardless of the cases that a TV broadcast is received or not, a signal is transmitted and received between transmitting/receiving section 2 and antenna 1.

The conventional portable device is not carried easily since including such separate antennas, antenna 1 for a mobile phone and antenna 5 for TV reception and accordingly having a large size and weight. In particular, Rod antenna 5 to receive TV broadcast signals has a large length of ¼ wavelengths of TV broadcast signals, thus preventing the portable device from being carried easily. For example, in order to receive VHF broadcasts (Channel 7 of VHF band in Japan), antenna 5 needs to have a length of about 40 cm.

SUMMARY OF THE INVENTION

A matching device causes an antenna to match a receiving section arranged to receive a signal in a first frequency band and a signal in a second frequency band lower than the first frequency band. The matching device includes a first terminal arranged to be connected to the antenna, a first inductor connected between the first terminal and a first node, a second inductor connected between the first node and a ground, a first capacitor connected between the first node and a second node, a second terminal arranged to be connected to the receiving section, the second terminal being connected to the second node, and a third inductor connected between the second node and the ground. The second inductor has a capacitive impedance in the first frequency band, and has an inductive impedance in the second frequency band.

This matching device can supply a signal in the second frequency band received by the antenna to the receiving section with a small loss. The antenna having a small length can receive a signal of low frequencies and long wavelengths in the second frequency band.

DETAILED DESCRIPTION OF PREFERRED EMBODIMENTS

Exemplary Embodiment 1

Figure 1:
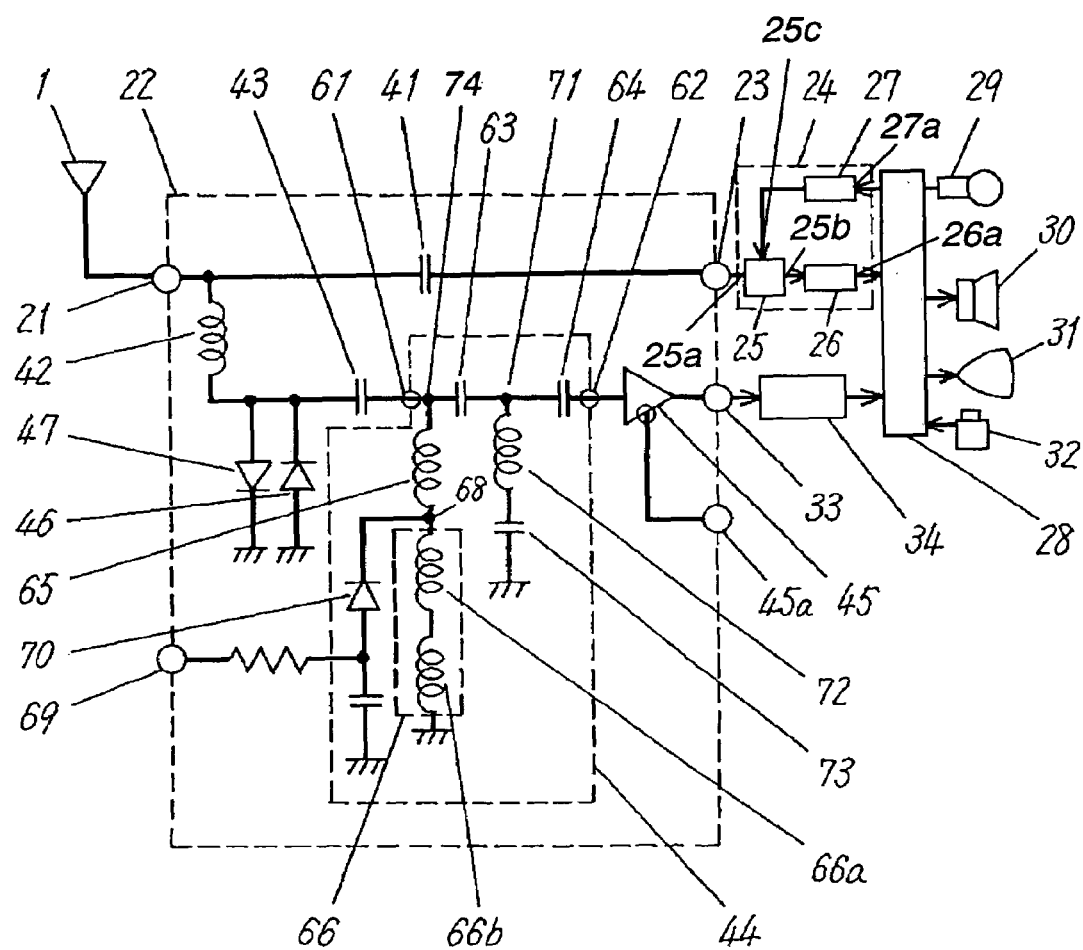
FIG. 1 is a block diagram of a portable receiver according to Exemplary Embodiment 1 of the present invention.

FIG. 1 is a block diagram of a portable receiver according to Exemplary Embodiment 1 of the present invention. Antenna 1 for a mobile phone receives a high frequency signal of about 820 MHz to 900 MHz, a mobile-phone signal. Antenna 1 accordingly has a length of about ¼ wavelengths of the signal, i.e., about 70 mm, so as to have an impedance of 50 Ω at the frequency of the mobile-phone signal. Antenna 1 is also used to receive TV broadcasts in VHF and UHF broadcast bands. Antenna 1 receives TV broadcast signals ranging from a lower limit frequency in the VHF broadcast band (about 50 MHz) to an upper limit frequency in the UHF broadcast band (about 770 MHz), and mobile-phone signals of about 820 MHz to 900 MHz.

Signals received by antenna 1 is supplied to input/output terminal 21 of splitter 22 also functioning as a matching device. Input/output terminal 23 outputs a mobile-phone signal out of the signals supplied to input/output terminal 21. The mobile-phone signal from input/output terminal 23 is supplied to transmitting/receiving section 24.

Transmitting/receiving section 24 includes diplexer 25 having input/output terminal 25a receiving a mobile-phone signal from input/output terminal 23, receiver 26 connected to output terminal 25b of diplexer 25, and transmitter 27 which is connected to input terminal 25c of diplexer 25. Input terminal 27a of transmitter 27 and output terminal 26a of receiver 26 are connected to signal processor 28. Signal processor 28 is connected with microphone 29, speaker 30 as an audio output unit; liquid crystal panel 31 as a display; and a data input key 32, as an input/output interface of the portable receiver.

Output terminal 33 of splitter 22 outputs a TV broadcast signal. Electronic tuner 34 is provided between output terminal 33 and signal processor 28. Electronic tuner 34 separates the received TV broadcast signals into three frequency ranges: the VHF low band (90 MHz to 108 MHz in Japan, 55 MHz to 88 MHz in the U.S.); the VHF high band (170 MHz to 222 MHz in Japan, 170 MHz to 216 MHz in the U.S.); and the UHF band (470 MHz to 770 MHz in Japan, 470 MHz to 806 MHz in the U.S.), selects and outputs a desired TV broadcast signal.

Figure 2:
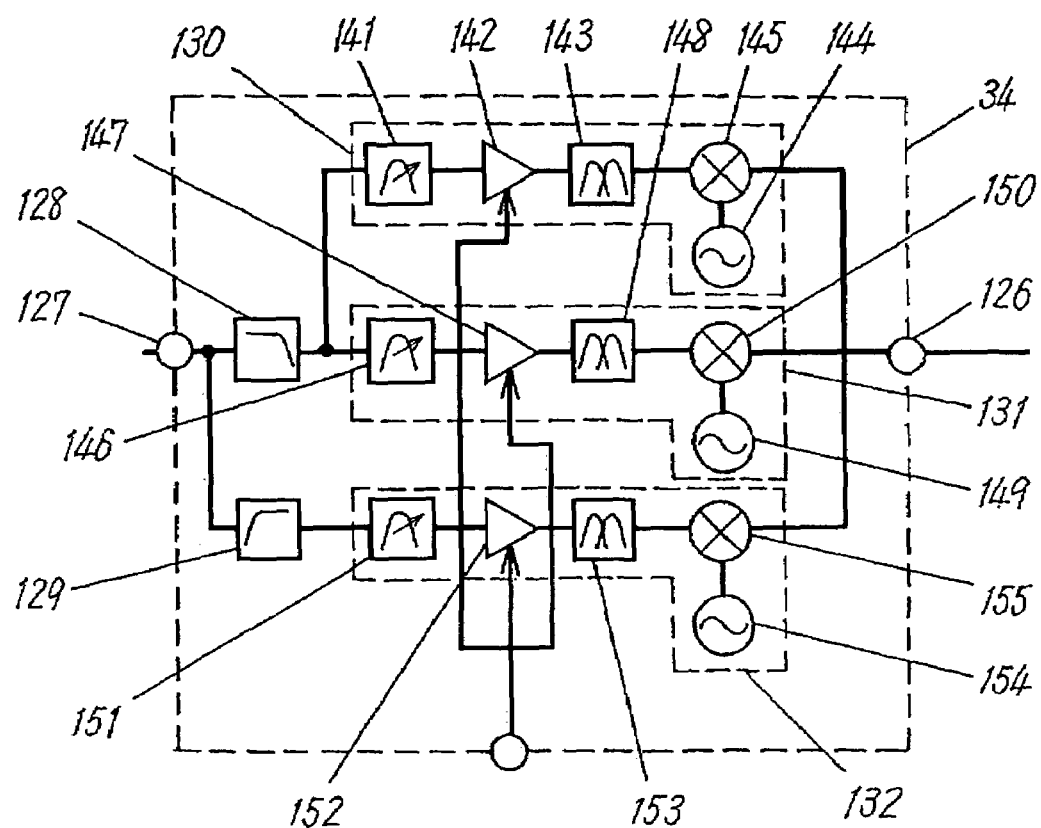
FIG. 2 is a schematic circuit block diagram of an electronic tuner of the portable receiver according to Embodiment 1.

Electronic tuner 34 will be described in detail below. FIG. 2 is a block diagram of electronic tuner 34. Electronic tuner 34 receives signals in the VHF low band, the VHF high band, and the UHF band. Input terminal 127 of tuner 34 is connected to output terminal 33 of splitter 22 outputting TV broadcast signals. Input terminal 127 is connected to low-pass filter 128 having a signal in the UHF band attenuate, and is connected to high-pass filter 129 having a signal in the VHF band attenuate. A signal output from low-pass filter 128 is supplied to VHF low band receiving section 130 and VHF high band receiving section 131. A signal output from high-pass filter 129 is supplied to UHF band receiving section 132. A signal output from UHF band receiving section 132, a signal output from VHF low band receiving section 130, and a signal output from VHF high band receiving section 131 are supplied to output terminal 126.

VHF low band receiving section 130 includes, filter 141 connected to an output of low-pass filter 128, high-frequency amplifier 142 connected to an output of filter 141, filter 143 connected to an output of high-frequency amplifier 142, mixer 145 having one input connected to an output of filter 143; and local oscillator 144 connected to the other input of mixer 145. Filter 141 is a single-tuned filter including a single tuning circuit. Filter 143 is a double-tuned filter including two tuning circuits.

VHF high band receiving section 131, similarly to VHF low band receiving section 130, includes filter 146 connected to an output of low-pass filter 128, high-frequency amplifier 147 connected to an output of filter 146, filter 148 connected to an output of high-frequency amplifier 147, mixer 150 having one input connected to an output of filter 148, and local oscillator 149 connected to the other input of mixer 150. Filter 146 is a single-tuned filter including a single tuning circuit. Filter 148 is a double-tuned filter including two tuning circuits.

UHF high band signal receiving section 132, similarly to VHF low band receiving section 130, includes: filter 151 connected to an output of high-pass filter 129, high-frequency amplifier 152 connected to an output of filter 151, filter 153 connected to an output of high-frequency amplifier 152, mixer 155 having one input connected to an output of filter 153, and local oscillator 154 connected to the other input of mixer 155. Filter 151 is a single-tuned filter including a single tuning circuit. Filter 153 is a double-tuned filter including two tuning circuits.

Splitter 22 will be described in detail below with reference to FIG. 1. Capacitor 41 is connected between input/output terminal 21 and input/output terminal 23. Capacitor 41 allows a mobile-phone signal input to input/output terminal 21 to pass to input/output terminal 23. Capacitor 41 has a capacitance of, e.g. 4 pF, and has an impedance at frequencies of TV broadcast signals larger than that at the frequency of the mobile-phone signal lower than frequencies of the TV broadcast signals. Therefore, the TV broadcast signals hardly pass through capacitor 41, and input/output terminal 23 mainly outputs the mobile-phone signal accordingly.

Inductor 42, capacitor 43, matching device 44, and amplifier 45 are connected in this order from input/output terminal 21 between input/output terminal 21 and input/output terminal 33. Amplifier 45 is turned on and off according to a signal supplied to control terminal 45a. Amplifier 45 provided between matching device 44 and electronic tuner 34 allows matching device 44 to match amplifier 45 having a stable input impedance, so that matching device 44 matches amplifier 45 each other easily. This arrangement prevents matching device 44 from being influenced by impedance fluctuation of electronic tuner 34, thus allowing the portable receiver according to Embodiment 1 to receive signals stably.

Diodes 46 and 47 are provided between a ground and a node connected to inductor 42 and capacitor 43 for DC cut, and force a high voltage, such as a static electricity put into input/output terminal 21, to flow to the ground, thus preventing transmitting/receiving section 2 and electronic tuner 34 from breaking. Diodes 46 and 47 are connected in polarities reverse to each other in order to ground both positive and negative voltages.

Matching device 44 will be described in detail as follows. Input terminal 61 of matching device 44 is connected to capacitor 43. Output terminal 62 of matching device 44 is connected to the input of amplifier 45. Capacitor 63 and capacitor 64 are serially connected in this order from input terminal 61 between input terminal 61 and output terminal 62.

Input terminal 61 is connected to node 74. Inductor 65 and inductor 66 are connected in series to each other between node 74 and the ground. Inductor 66 is assembly 66 consisting of inductors 66a and 66b connected in series with each other. A assembly consisting of assembly 66 and inductor 65 connected in series with each other provides an inductor. Switch 70 is connected between the ground and node 68 provided between inductors 65 and 66, and formed of a diode turned on and off with a voltage supplied to control terminal 69.

Inductor 72 and capacitor 73 are connected in series with each other between the ground and node 71 provided between capacitors 63 and 64. Inductor 72 has a self resonance frequency higher than the frequencies of the mobile-phone signals. That is, inductor 72 has an inductive impedance at the frequencies of TV broadcast signals and the mobile-phone signals. Consequently, inductor 72 and capacitor 73 provides a trap allowing a predetermined frequency to pass. In matching device 44 of Embodiment 1, inductor 72 and capacitor 73, having values determined appropriately, adjust the frequency of the trap to the frequencies of mobile-phone signals. For example, inductor 72 having an inductance of 22 nH and capacitor 73 having a capacitance of 1 pF provides the trap allowing a frequency of about 850 MHz to pass, thereby preventing the mobile-phone signals from flowing to output terminal 62.

Figure 3A:
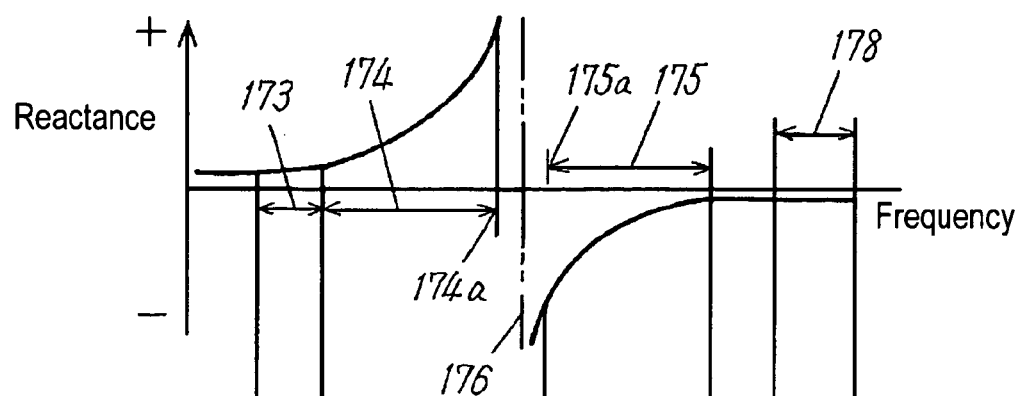
FIG. 3A shows reactance characteristics of an inductor of a matching device according to Embodiment 1.
Figure 3B:
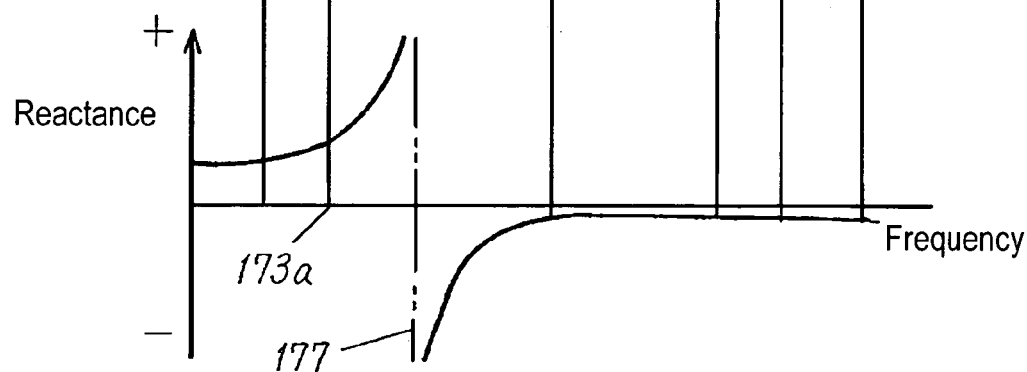
FIG. 3B shows reactance characteristics of the inductor of the matching device according to Embodiment 1.

FIGS. 3A and 3B show reactance characteristics of inductors in matching device 44 of Embodiment 1. FIG. 3A shows reactance characteristics of inductor 65, and FIG. 3B shows reactance characteristics of an inductor provided by inductor 65 and assembly 66. A reactance in a plus direction of the vertical axis is inductive, and a reactance in a minus direction of the axis is capacitive.

As shown in FIG. 3A, impedance Z1 of inductor 65 is inductive in frequency range 173 of the VHF low band and in frequency range 174 of the VHF high band. Impedance Z1 is capacitive in frequency range 175 of the UHF band and in frequency range 178 of the mobile-phone signals. These characteristics are obtained by setting self resonant frequency 176 of inductor 65 between highest frequency 174a in frequency range 174 of the VHF high band (referred to as a high end frequency in the VHF high band) and lowest frequency 175a in frequency range 175 of the UHF band (referred to as a low end frequency in the UHF band).

As shown in FIG. 3B, impedance Z2 of the inductor provided by inductor 65 and assembly 66 is inductive in frequency range 173 of the VHF low band. Impedance Z2 is capacitive in frequency range 175 of the UHF band and in frequency range 178 of the mobile-phone signals. These characteristics are obtained by setting self resonant frequency 177 of the inductor provided by inductor 65 and assembly 66 between highest frequency 173a in frequency range 173 of the VHF low band (referred to as a high end frequency in the VHF low band) and low end frequency 175a in the UHF band. The relation between these frequencies and impedances Z1 and Z2 is shown in Table 1.

TABLE 1

| | VHF Low Band | VHF High Band | UHF Band/ Mobile-Phone |
| --- | --- | --- | --- |
| Frequency (Japan) (MHz) | 99–108 | 170–222 | 470–900 |
| Z1 | Inductive | Inductive | Capacitive |
| Z2 | Inductive | Inductive or Capacitive | Capacitive |

Operations of splitter 22 and matching device 44 in splitter 22 of Embodiment 1 will be described below.

Figure 4:
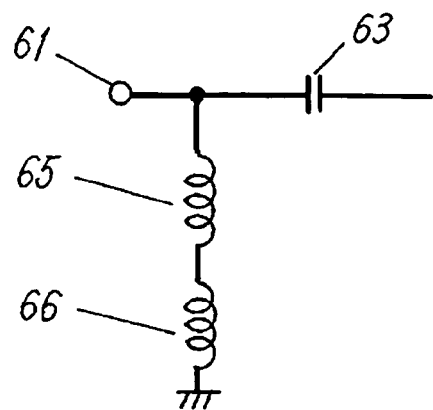
FIG. 4 is an equivalent circuit diagram of the matching device according to Embodiment 1.
Figure 5:
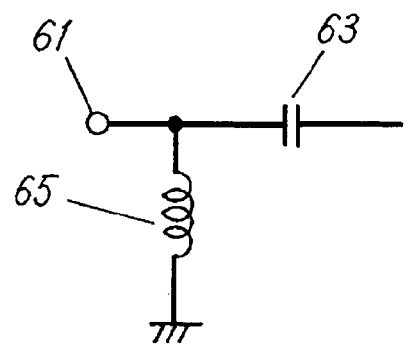
FIG. 5 is an equivalent circuit diagram of the matching device according to Embodiment 1.
Figure 6:
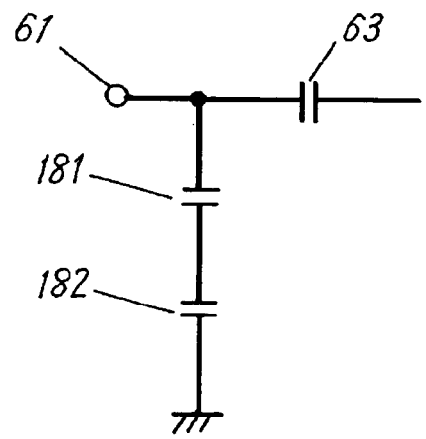
FIG. 6 is an equivalent circuit diagram of the matching device according to Embodiment 1.
Figure 7:
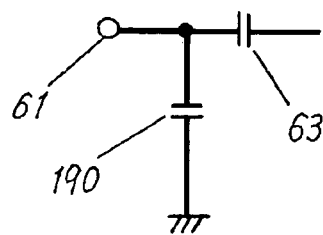
FIG. 7 is an equivalent circuit diagram of the matching device according to Embodiment 1.

FIG. 4 shows an equivalent circuit of matching device 44 at frequencies in the VHF low band. FIG. 5 shows an equivalent circuit of matching device 44 at frequencies in the VHF high band. FIGS. 6 and 7 are equivalent circuits of matching device 44 at frequencies in the UHF band.

In matching device 44 of Embodiment 1, switch 70 is turned off when a signal in the VHF low band is received, and is turned on when a signal in the VHF high band is received. When receiving a signal in the UHF band, switch 70 is turned on in the portable receiver according to Embodiment 1 while switch 70 may be turned either on or off.

First, an operation of matching device 44 for receiving a signal in the VHF low band will be described with reference to FIG. 4. When a signal in the VHF low band is received, switch 70 (FIG. 1) is turned off, and inductors 65 and 66 are provided between input terminal 61 and the ground. Since inductors 65 and 66 are connected in series with each other, the inductor provided by these inductors has an inductance large enough to allow matching device 44 to match the impedance of antenna 1 with that of amplifier 45 at a low frequency in the VHF low band.

An operation of matching device 44 for receiving a signal in the VHF high band will be described with reference to FIG. 5. When a signal in the VHF high band is received, switch 70 is turned on, and inductor 65 is connected to the ground. This operation causes inductor 65 to be provided exclusively between input terminal 61 and the ground, as shown in FIG. 5. Then, the inductance of the inductor between input terminal 61 and the ground decreases, thereby allowing making matching device 44 to match the impedance of antenna 1 to that of amplifier 45 at frequencies in the VHF high band. Switch 70 functions as a selector for switching the inductance of the inductor provided by inductors 65 and 66.

An operation of matching device 44 for receiving a signal in the UHF band will be described with reference to FIG. 6. FIG. 6 is an equivalent circuit diagram of matching device 44 including switch turned off for receiving a signal in the UHF band. FIG. 7 is an equivalent circuit diagram of matching device 44 including switch 70 turned on for receiving a signal in the UHF band. As shown in FIG. 3B, inductors 65 and 66 have capacitive impedances at frequencies in the UHF band. Therefore, when a signal in the UHF band is received, capacitors are provided between input terminal 61 and the ground, as shown in FIGS. 6 and 7. That is, when a signal in the UHF band is received, matching device 44 is regarded to be formed only of these capacitors.

As shown in FIGS. 3A and 3B, the impedances of inductors 65 and 66 are capacitive at frequencies in or higher than the UHF band, so that the impedances are also capacitive in frequency range 178 of mobile-phone signals, which have frequencies higher than frequencies in the UHF band.

In matching device 44 of Embodiment 1, a signal in the UHF band is received when switch 70 is turned on. This operation allows capacitor 190 provided by inductor 65 to be inserted between input terminal 61 and the ground. In this case, self resonant frequency 176 of inductor 65 is set between high end frequency 174*a* in the VHF high band and low end frequency 175*a* in the UHF band.

In matching device 44, a signal in the UHF band may be received when switch 70 is turned off. In this case, as shown in FIG. 6, an assembly composed of capacitor 181 formed by inductor 65 and capacitor 182 formed by inductor 66 connected with each other is provided between input terminal 61 and the ground. In this case, self resonant frequency 176 of inductor 65 and self resonant frequency 177 of inductor 66 are both set between high end frequency 173*a* in the VHF low band and low end frequency 175*a* in the UHF band. Thus, it is important that the self resonant frequency of an inductor which allows a signal to pass through is not in the frequency range of the signal.

In the cases that matching can be performed with a small inductance in the VHF high band, and that the self resonant frequency is higher than the low end frequency in the UHF band, matching device 44 receives a signal in the UHF band when switch 70 is turned off.

Figure 8:
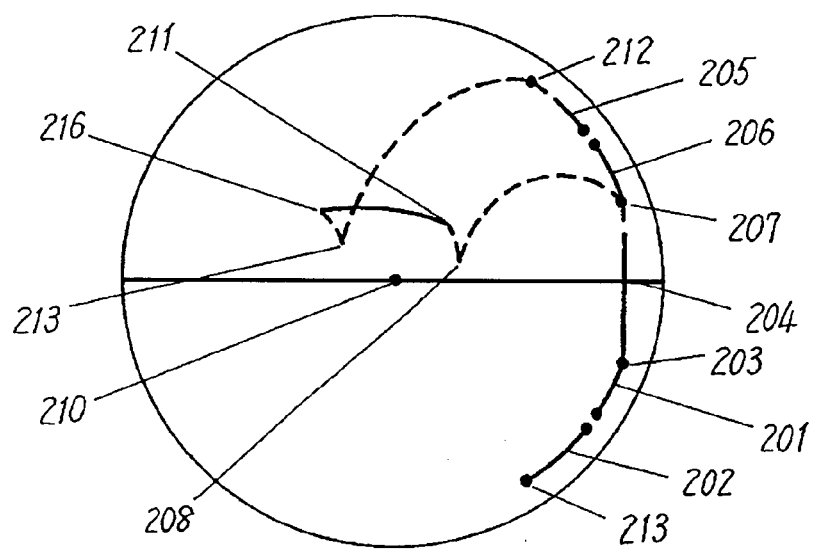
FIG. 8 is a Smith chart of an antenna and the matching device according to Embodiment 1.

Then, an operation of matching device 44 to match the impedance of antenna 1 with that of amplifier 45 at frequencies of TV broadcast signals will be described. FIG. 8 is a Smith chart of antenna 1 and matching device 44 for receiving a signal in the VHF band. The upper half of the circle of the Smith chart represents inductive impedances, and the lower half of the circle represents capacitive impedances. The center is equal to the impedance of amplifier 45.

In FIG. 8, line 201 represents the impedance of antenna 1 in the VHF low band, and line 202 represents the impedance of antenna 1 in the VHF high band. For example, antenna 1 may be a bar antenna having a length of 70 mm, and have an electric length much shorter than ¼ wavelengths of signals to be received, having a small impedance. Since even the highest frequency in the VHF high band has a wavelength of 1,300 mm, antenna 1 has an electric length shorter than ¼ wavelength and a small impedance. Further, since the frequency of the lowest channel in the VHF low band has a wavelength of 3,330 mm, the impedance of antenna 1 is much smaller, and the impedance at the lowest frequency in the VHF band is extremely small, as shown in FIG. 8.

Under the above condition, if antenna 1 is directly connected with amplifier 45, the impedances of them do not match, thereby having the signal attenuate.

Matching device 44 including capacitors 63 and 64 and inductors 65 and 66 as impedance elements for matching allows antenna 1 to match amplifier 45 at frequencies of long wavelengths preventing the impedances from matching. That is, the input impedance of matching device 44 matches the impedance of antenna 1. In this case, the input impedance of matching device 44 needs to be positioned substantially symmetrical to the impedance (lines 201 and 202) of antenna 1 with respect to line 204. First, the inductance of inductor 65 is determined so as to cause impedance 205 of matching device 44 in the VHF high band to match impedance 202 of antenna 1. Then, the inductance of inductor 66 is determined so as to cause impedance 206 of matching device 44 in the VHF low band to match impedance 201 of antenna 1. Subsequently, the values of capacitors 63 and 64 are determined appropriately so that the impedance of matching device 44 at output terminal 62 approaches the input impedance (the center in FIG. 8) of amplifier 45 at frequencies in the VHF low band and the VHF high band.

In order to cause the impedance of antenna 1 to match the impedance of matching device 44, the impedances of antenna 1 and matching device 44 are positioned in a complex domain, that is, are determined to be positioned symmetrically with respect to line 204. To achieve this, a small resistance of antenna 1 itself is determined to be substantially equal to a resistance component of the impedance of matching device 44 at input terminal 61, thereby making their impedances substantially equal to each other. Therefore, according to Embodiment 1, small resistance components of inductors 65 and 66 themselves are determined to be substantially equal to the resistance of the antenna itself.

Types or the number of elements used as inductors 65 and 66 or a circuit to compose these elements may be determined appropriately, thereby causing the resistance of the impedance of matching device 44 at input terminal 61 to be substantially equal to the resistance of the impedance of antenna 1. This arrangement enables matching device 44 to allow antenna 1 much shorter than ¼ wavelengths of signals to be received to match amplifier 45. Thus, the portable receiver according to Embodiment 1 can receive signals of low frequencies, such as the VHF low band, with small antenna 1 for receiving mobile-phone signals.

Then, the impedance of each element in matching device 44 at the low end frequency in the VHF low band and at the high end frequency in the VHF high band will be explained. First, at the low end frequency in the VHF low band, the impedance of matching device 44 at input terminal 61 becomes impedance 207 due to the inductance of the inductor consisting of inductors 65 and 66, and then, changes into impedance 211 near center 210 due to capacitors 63 and 64.

When a signal in the VHF high band is received, inductor 65 is exclusively provided between input terminal 61 and the ground, so that the inductance of the inductor between input terminal 61 and the ground is smaller than the impedance for receiving a signal in the VHF low band. Accordingly, when the high end frequency signal in the VHF high band is received, the impedance at input terminal 61 becomes impedance 212 substantially symmetrical to impedance 213 of antenna 1 at the high end frequency in the VHF high band with respect to line 204. Then, impedance 213 changes into impedance 216 near center 210 due to capacitors 63 and 64.

Figure 9:
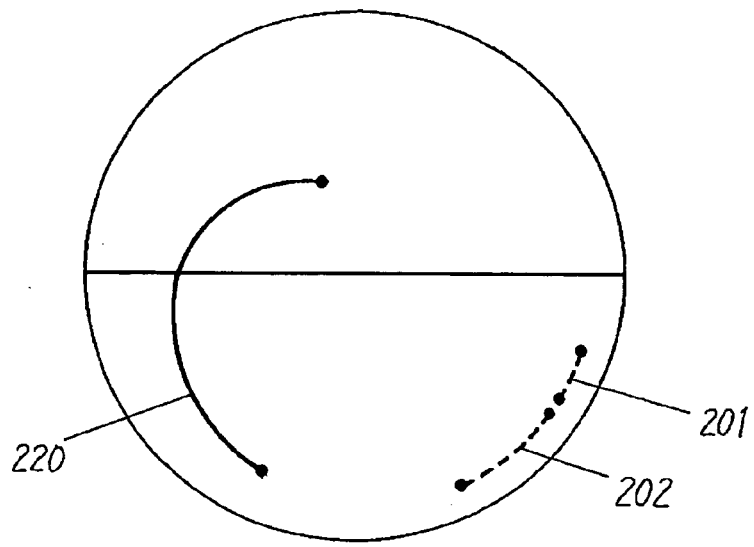
FIG. 9 is a Smith chart of the antenna and the matching device according to Embodiment 1.

Then, reception of a signal in the UHF band will be described below with reference to FIG. 9. In FIG. 9, line 220 represents the impedance of antenna 1 receiving a signal in the UHF band. Around the highest frequency in the UHF band (the high end frequency in the UHF band), antenna 1 has an inductive impedance since having an electric length of about ¼ wavelength. When a signal in the UHF band is received, each inductor of matching device 44 has a capacitive impedance, and the impedance of matching device 44 can easily approach the impedance complex domain of antenna 1. In other words, the impedance of matching device 44 can become easily symmetrical to the impedance of antenna 1 with respect to line 204.

Around the low end frequency in the UHF band, both the impedances of antenna 1 and matching device 44 are capacitive, so that antenna 1 cannot match matching device 44. However, since impedances of capacitors are inversely proportional to frequencies, the impedance of matching device 44 composed exclusively of capacitance components becomes small for signals in the UHF band, thereby reducing signal loss.

In matching device 44 according to Embodiment 1, inductor 65 has an inductance of 82 nH, and inductors 66a and 66b have inductances of 120 nH. Capacitor 63 has a capacitance of 22 pF, and capacitor 64 has a capacitance of 27 pF. This arrangement causes matching device 44 to match antenna 1 in both the VHF low band and the VHF high band, and to have a small signal loss in the UHF band.

Matching device 44 having the aforementioned structure enables the impedance at input terminal 61 of matching device 44 to match the impedance of antenna 1 when receiving a signal in the VHF band, and causes the input impedance of amplifier 45 to be close to the impedance of matching device 44 at output terminal 62. The output impedance of amplifier 45 is stable at, e.g. about 75 Ω. The input impedance of electronic tuner 34 may be determined to be about 75 Ω so that splitter 22 matches electronic tuner 34, thereby reducing signal loss.

Thus, matching device 44 can match antenna 1 and tuner 34 in each of the VHF band low band and the VHF high band by switching between the VHF low band and the VHF high band. Furthermore, since matching device 44 has a capacitive impedance in the UHF band, signal loss in device 44 is small. As a result, matching device 44 having a simple circuit can transmit signals in each band to tuner 34 without loss, thereby having a small size and being inexpensive.

Then, an operation of splitter 22 including matching device 44 of Embodiment 1 will be explained below. In splitter 22, inductor 42 is provided between input/output terminal 21 and input terminal 61 of matching device 44.

When switch 70 is turned off, inductor 65 and assembly 66 have capacitive impedances at frequencies of mobile-phone signals, so that inductors 42 and 65 and assembly 66 provide a low-pass filter. When switch 70 is turned on, inductor 65 has the capacitive impedance, so that inductors 42 and 65 provide a low-pass filter at frequencies of mobile-phone signals. Having cutoff frequencies lower than the lowest frequency in the frequency range of the mobile-phone signals, the low-pass filters prevent mobile-phone signals from flow to electronic tuner 34.

That is, the inductances of inductors 42 and 65 and assembly 66 (inductors 66a and 66b) are determined appropriately, and accordingly, the cutoff frequencies of the low-pass filters is between the frequency range of mobile-phone signals and the frequency range of TV broadcast signals. This arrangement allows the mobile-phone signals not to pass through splitter 22, but to TV broadcast signals to pass through splitter 22, thus having the TV broadcast signals output from output terminal 33.

In splitter 22 of Embodiment 1, the inductance of inductor 42 may be 15 nH to provide the low-pass filter for allowing signals of frequencies in the UHF band to pass through the filter and for having mobile-phone signals attenuate.

In the aforementioned structure, since inductor 65 and assembly 66 have the capacitive impedances for the mobile-phone signals, inductor 42 connected to them, thereby providing the low-pass filter. This low-pass filter has a large impedance for the mobile-phone signals, and has a small impedance for TV broadcast signals. Therefore, splitter 22 supplies TV broadcast signals to output terminal 33, while not allowing the mobile-phone signals to pass through it.

Since the TV broadcast signals have lower frequencies than mobile-phone signals, capacitor 41 has a large impedance for the TV broadcast signals. Matching device 44 allows antenna 1 to match amplifier 45 and electronic tuner 34 at the frequencies of the TV broadcast signals, so that matching device 44 may have a small impedance at the frequencies of the TV broadcast signals.

In the aforementioned structure, regardless of the existence of the TV broadcast signals and a frequency range to be received, mobile-phone signals received by antenna 1 are supplied to receiver 26 via input/output terminal 23, and mobile-phone signals input from transmitter 27 are supplied to antenna 1. The TV broadcast signals is output towards output terminal 33 even when the mobile-phone signals are transmitted and received.

The above structure provides a small, portable receiver capable of receiving TV broadcast signals having long wavelengths and low frequencies at short antenna 1 adapted to receive mobile-phone signals having short wavelengths and high frequencies.

At frequencies of the TV broadcast signals, splitter 22 has the impedance at output terminal 33 smaller than the impedance at input/output terminal 23. This causes the TV broadcast signals to flow to matching device 44, thereby reducing loss of the TV broadcast signals in splitter 22. At frequencies of mobile-phone signals, splitter 22 has the impedance at input/output terminal 23 smaller than the impedance at output terminal 33. This causes mobile-phone signals to hardly flow to matching device 44, thereby reducing loss of the mobile-phone signals in splitter 22.

Since capacitor 41 is exclusively provided between input/output terminal 21 and input/output terminal 23, the portable receiver according to Embodiment 1 can transmit and receive the mobile-phone signals even when the TV broadcast signals are being received.

When a signal in the VHF low band is received, splitter 22 cannot match antenna 1 at the VHF high band. Therefore, when a signal in the VHF low band is received, signals in the VHF high band hardly pass through splitter 22. When a signal in the VHF high band is received, splitter 22 cannot match antenna 1 in the VHF low band. Therefore, when a signal in the VHF high band is received, signals in the VHF low band hardly pass through splitter 22. Therefore, matching device 44 provided before low-pass filter 128 of electronic tuner 34 allows single-tuned filters 141 and 146 and double-tuned filters 143, 148, and 158 to have sharp attenuation characteristics, thereby simplifying these filters. As a result, electronic tuner 34 can be inexpensive and receive signals input to antenna 1 without loss.

Splitter 22 including matching device 44 can match antenna 1 having a length much shorter than ¼ wavelength of a desired signal to be received, and therefore, reduces the size of antenna 1, hence providing a small portable receiver which can be carried easily.

Since switch 70 is not provided in a path of signals, switch 70 does not produce loss of signals.

In the portable receiver according to Embodiment 1, antenna 1 for a mobile phone is used commonly to receive TV broadcast signals and mobile-phone signals. Splitter 22 separates these signals from each other and outputs them, and matches antenna 1 for TV broadcast signals. The receiver according to Embodiment 1 may include respective antennas for mobile-phone signals and for TV broadcast signals. Even in that case, matching device 44 allows antennas having lengths shorter than ¼ wavelengths of the TV broadcast signals to match the tuner.

In the portable receiver according to Embodiment 1 for receiving signals in various frequency ranges, the low-pass filters provided by inductors 42, 65, and 66 can reduce signals which enter into a portion easily suffering interference like electronic tuner 34, such as mobile-phone signals. In other words, when inductors 65 and 66 have capacitive impedances at unnecessary, high frequency signals having frequencies higher than the frequency range to be received, inductors 42, 65, and 66 provides a low-pass filter. This low-pass filter accordingly reduces the unnecessary high frequency signals, thereby preventing the receiver according to Embodiment 1 from interference caused by signals in frequency range higher than signals to be received.

Exemplary Embodiment 2

Figure 10:
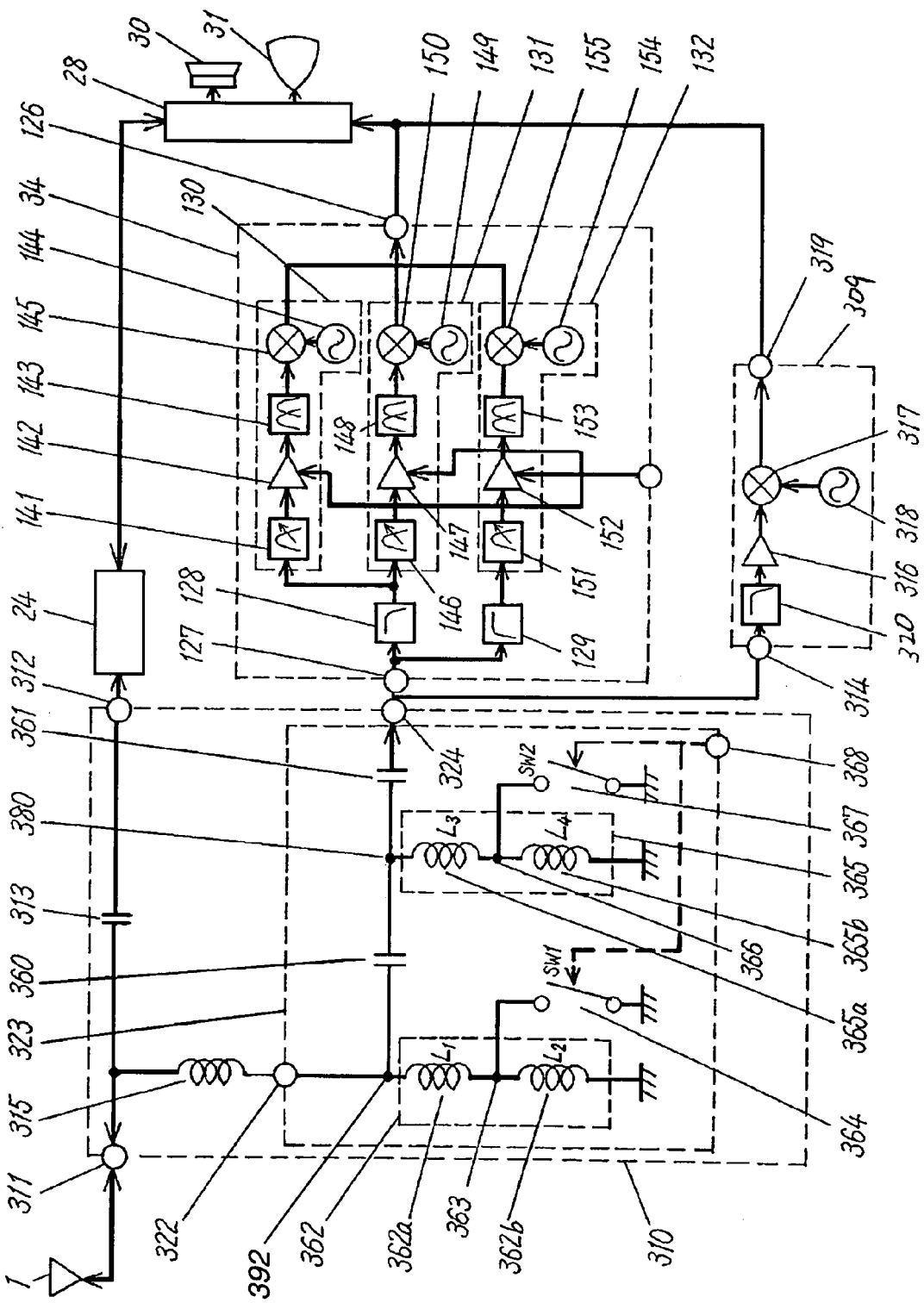
FIG. 10 is a block diagram of a portable receiver according to Exemplary Embodiment 2 of the invention.

FIG. 10 is a block diagram of a portable receiver according to Exemplary Embodiment 2 of the present invention. In FIG. 10, the same elements as those shown in FIG. 1 will be denoted by the same reference numerals and their description will be briefed. The receiver according to Embodiment 2 includes a diplexer functioning as a matching device capable of receiving FM broadcast and TV broadcast, and performing communication with a mobile phone. Antenna 1 receives FM broadcast signals ranging from 76 MHz to 108 MHz as well as TV broadcast signals and mobile-phone signals of about 850 MHz.

As shown in FIG. 10, antenna 1 is connected to high-frequency input/output terminal 311 of splitter 310, and input/output terminal 312 outputs mobile-phone signals. Input/output terminal 312 is connected to transmitting/receiving section 24 and supplies the mobile-phone signals to the section. Transmitting/receiving section 24 is connected to signal processor 28. In splitter 310, output terminal 324 for outputting TV broadcast signals is connected to electronic tuner 34 and FM tuner 309. An output of electronic tuner 34 and an output of FM tuner 309 are connected to signal processor 28. Signal processor 28 is connected to microphone 29 and input key 32 as input units, and is connected to speaker 30 and liquid crystal panel 31 as output units.

In the receiver according to Embodiment 2, input/output terminal 311 receives high frequency signals from 76 MHz, the FM broadcast band, to about 850 MHz, a mobile-phone signal range.

FM tuner 309 of Embodiment 2 will be described below. Input terminal 314 for receiving signals in the FM broadcast band is connected to output terminal 324 of splitter 310. Low-pass filter 320 is connected to input terminal 314. Amplifier 316 is connected to an output of low-pass section 320. Mixer 317 has one input connected to an output of amplifier 316, and has the other input for receiving a signal output from local oscillator 318. Mixer 317 converts FM broadcast signals into intermediate frequency signals, and supplies the converted signals through output terminal 319 to signal processor 28.

In splitter 310, capacitor 313 is provided between input/output terminal 311 and input/output terminal 312. Inductor 315 and matching device 323 are connected between input/output terminal 311 and output terminal 324 in this order from input/output terminal 311.

Matching device 323 will be described in detail below. Matching device 323 has input terminal 322 and output terminal 324. Output terminal 324 is connected to electronic tuner 34. Electronic tuner 34 selects a signal of a desired channel out of signals supplied from output terminal 324, converts the signal into intermediate frequency signals having an intermediate frequency (58.75 MHz in Japan, 45.75 MHz in the U.S.), and supplies the converted signals to signal processor 28.

Input terminal 322 of matching device 323 is connected to node 392. Capacitor 361 is connected in series with capacitor 360 and between output terminal 324 and capacitor 360 connected to node 392. Inductor 362 is connected between input terminal 322 and a ground. Inductor 365 is connected between the ground and node 380 connected to capacitors 360. Inductor 362 is an assembly including inductors 363a and 362b serially connected with each other. Inductor 362a is provided closer to input terminal 322 than inductor 362b. Switch 364 is connected between the ground and node 363 connected to inductors 362a and 362b.

Inductor 365 is an assembly including inductors 365a and 365b connected with each other. Inductor 365a is provided closer to capacitor 360 than inductor 365b. Switch 367 is connected between the ground and node 366 connected to inductors 365a and 365b.

Switches 364 and 367 are connected to control terminal 368 provided in matching device 323, and are turned on and off simultaneously to each other.

Figure 11A:
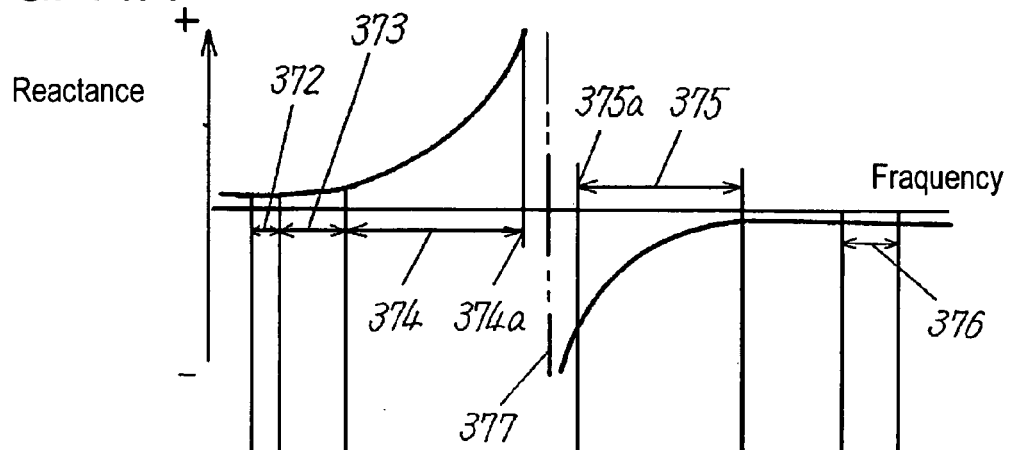
FIG. 11A shows reactance characteristics of an inductor of a matching device according to Embodiment 2.
Figure 11B:
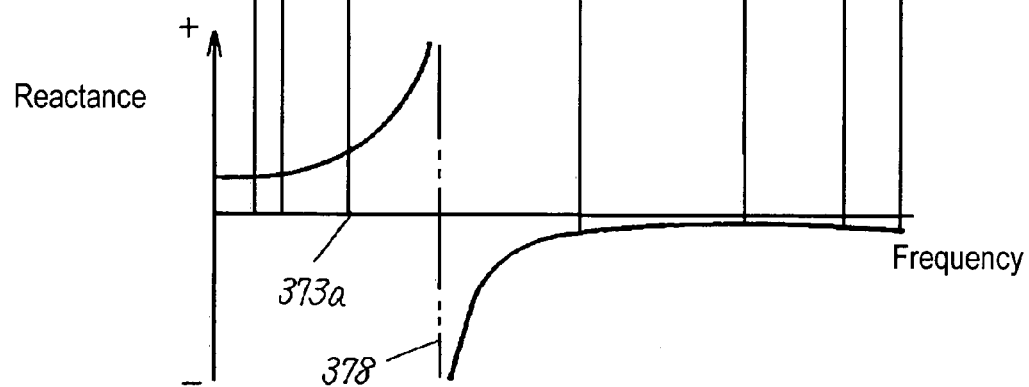
FIG. 11B shows reactance characteristics of an inductor of the matching device according to Embodiment 2.

FIG. 11A shows reactance characteristics of inductors 362a and 365a. FIG. 11B shows reactance characteristics of inductors 362b and 365b. Reactances in the plus direction of the vertical axis are inductive, and reactances in a minus direction of the axis are capacitive.

According to Embodiment 2, as shown in FIG. 11A, inductors 362a and 365a have inductive impedances in frequency range 372 of FM broadcast signals, frequency range 373 of the VHF low band, and frequency range 374 of the VHF high band. Inductors 362a and 365a have capacitive impedances in frequency range 375 of the UHF band and frequency range 376 of the mobile-phone signals. These characteristics are obtained by determining self resonant frequency 377 of inductors 362a and 365a to be between highest frequency 374a in frequency range 374 of the VHF high band (referred to as the high end frequency in the VHF high band) and lowest frequency 375a in frequency range 375 of the UHF band (referred to as the low end frequency in the UHF band).

As shown in FIG. 11B, inductors 362b and 365b have inductive impedances in frequency range 372 of FM broadcast signals and in frequency range 373 of the VHF low band, and have capacitive impedances in frequency range 375 of the UHF band and in frequency range 372 of the mobile-phone signals. These characteristics are obtained by determining self resonant frequency 378 of inductors 362b and 365b to be between highest frequency 373a in frequency range 373 of the VHF low band (referred to as the high end frequency in the VHF low band) and low end frequency 375a in the UHF band. These receiving frequencies and status of the switches are shown in Table 2. The receiving frequencies and respective impedances Z3, Z4, Z5, and Z6 of inductors 362a, 362b, 365a, and 365b are shown in Table 3.

TABLE 2

|  | FM Broadcast/ VHF Low Band | VHF High Band | UHF Band/ Mobile Phone |
|---|---|---|---|
| Frequency (Japan) (MHz) | 76–108 | 170–222 | 470–900 |
| Switch 364 | Off | On | On or Off |
| Switch 367 | Off | On | On or Off |

TABLE 3

|  | VHF Low Band | VHF High Band | UHF Band/ Mobile-Phone |
|---|---|---|---|
| Frequency (Japan) (MHz) | 99–108 | 170–222 | 470–900 |
| Z3 | Inductive | Inductive | Capacitive |
| Z4 | Inductive | Inductive or Capacitive | Capacitive |
| Z5 | Inductive | Inductive | Capacitive |
| Z6 | Inductive | Inductive or Capacitive | Capacitive |

Figure 12:
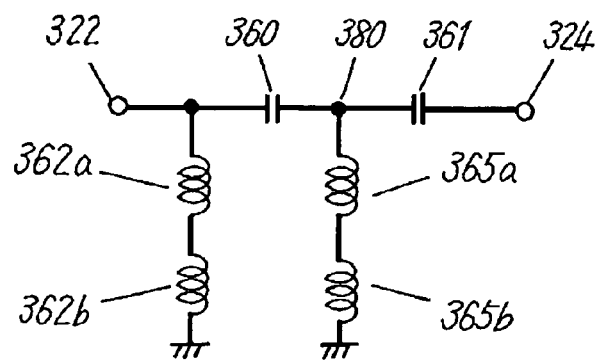
FIG. 12 is an equivalent circuit diagram of the matching device according to Embodiment 2.
Figure 13:
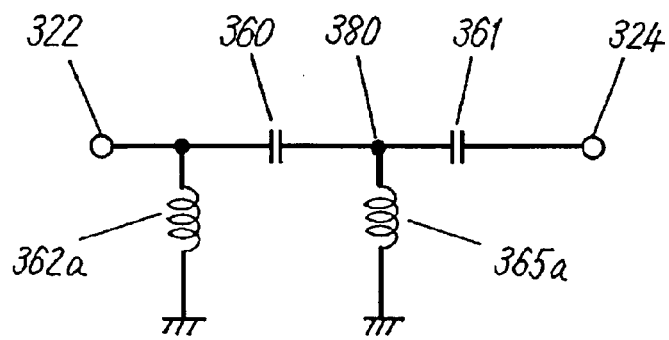
FIG. 13 is an equivalent circuit diagram of the matching device according to Embodiment 2.
Figure 14:
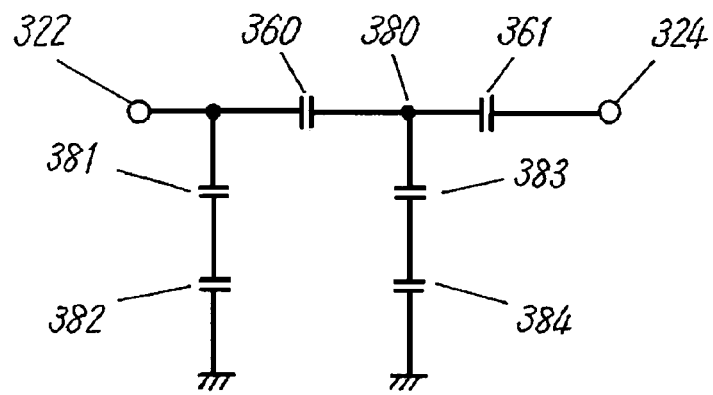
FIG. 14 is an equivalent circuit diagram of the matching device according to Embodiment 2.
Figure 15:
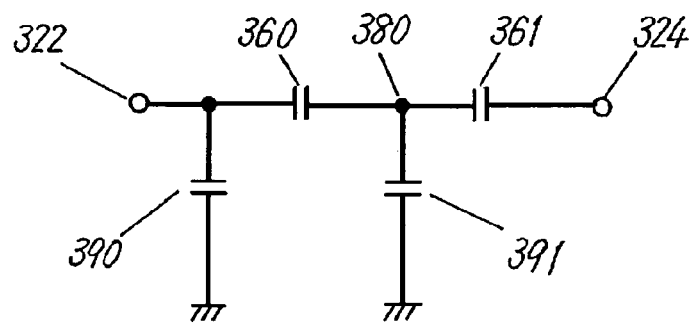
FIG. 15 is an equivalent circuit diagram of the matching device according to Embodiment 2.

An operation for receiving signals of matching device 323 having the aforementioned structure will be described below. FIG. 12 is an equivalent circuit of matching device 323 receiving a signal in the VHF low band. FIG. 13 is an equivalent circuit of matching device 32 receiving signals in the VHF high band. FIGS. 14 and 15 are equivalent circuits of matching device 323 receiving signals in the UHF band.

As shown in Table 2, in matching device 323, switches 364 and 367 are both turned off when a signal in the FM broadcast band or the VHF low band is received. Switches 364 and 367 are both turned on when a signal in the VHF high band is received. When a signal in the UHF band is received and when a mobile-phone signal is transmitted or received, switches 364 and 367 may be turned either on or off. In matching device 323 of Embodiment 2, switches 364 and 367 are both turned on when a signal in the UHF band is received. Thus, switches 364 and 367 function as a selector for switching inductances of inductors 362 and 365.

When a signal in the FM broadcast band and when the VHF low band is received, as shown in FIG. 12, an assembly including inductors 362a and 362b connected in series with each other is connected between input terminal 322 and a ground. An assembly including inductors 365a and 365b connected in series with each other is connected between node 380 and the ground. The inductors including inductors connected in series with each other have a large inductance, thereby enabling matching device 323 to match antenna 1 at a low frequency in the FM broadcast band and the VHF low band.

As shown in FIG. 13, when a signal in the VHF high band is received, inductors 362a and 365a are both connected directly to the ground. This arrangement causes inductors 362 and 365 to have small inductances when a signal in the VHF high band is received, thereby allowing the impedance of matching device 323 to match antenna 1 at frequencies in the VHF high band.

FIG. 14 shows an equivalent circuit diagram of matching device 323 including switches 364 and 367 both turned off for the UHF band when. FIG. 15 shows an equivalent circuit diagram of matching device 323 including switches 364 and 367 are both turned on for the UHF band. As shown in FIGS. 11A and 11B, inductors 362a, 362b, 365a, and 365b have capacitive impedances at frequencies in the UHF band. Therefore, when a signal in the UHF band is received, matching device 323 can be regarded to exclusively include capacitors.

In matching device 323 of Embodiment 2, a signal in the UHF band is received when switches 364 and 367 are both turned on. In this case, capacitor 390 provided by inductor 362a is connected between input terminal 322 and the ground, while capacitor 391 formed by inductor 365a is connected between node 380 and the ground. In this case, self resonant frequency 377 of inductors 362a and 365a is determined to be between high end frequency 374a in the VHF high band and low end frequency 375a in the UHF band.

In the case that switches 364 and 367 are both turned off for receiving a signal in the UHF band, as shown in FIG. 14, an assembly including capacitor 381 provided by inductor 362a and capacitor 382 provided by inductor 362b which are connected in series with each other between input terminal 322 and the ground. An assembly including capacitor 383 provided by inductor 365a and capacitor 384 provided by inductor 365b which are connected in series with each other between node 380 and the ground. In this case, self resonant frequencies of inductors 362a, 362b, 365a, and 365b are determined to be between high end frequency 373a in the VHF low band and low end frequency 375a in the UHF band.

Note that it is important that the self resonant frequencies of inductors 362a, 362b, 365a, and 365b do not provided in the frequency range to be received.

Figure 16:
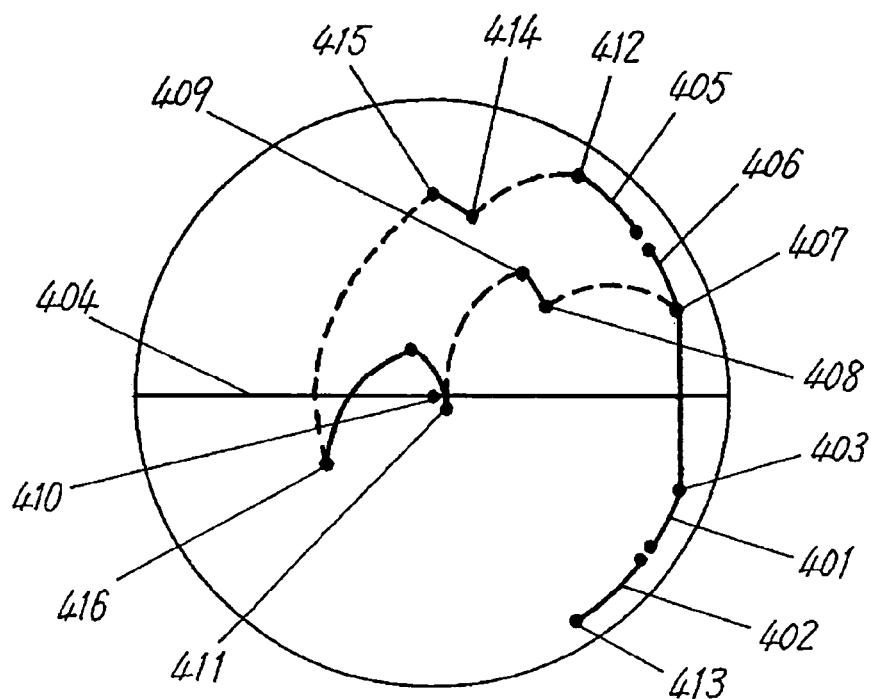
FIG. 16 is a Smith chart of an antenna and the matching device according to Embodiment 2.
Figure 17:
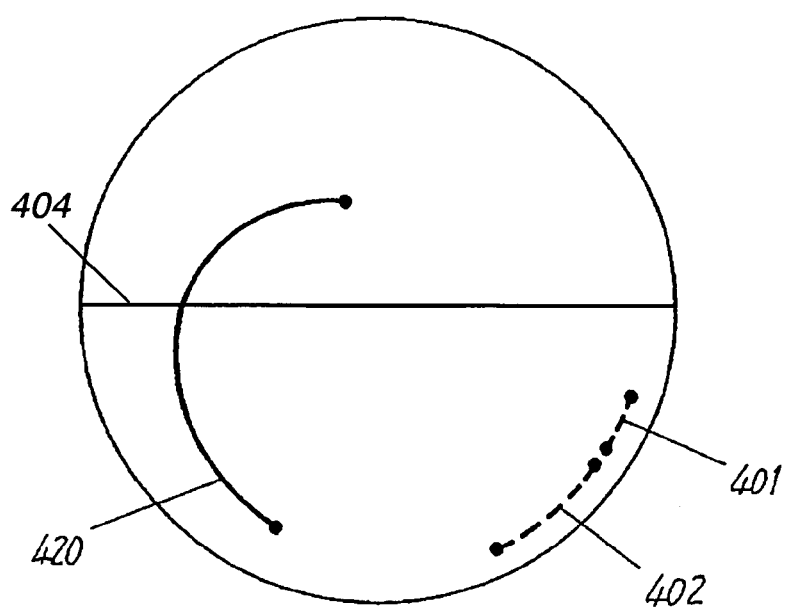
FIG. 17 is a Smith chart of the antenna and the matching device according to Embodiment 2.

An operation of matching device 323 will be described below. FIG. 16 is a Smith chart of antenna 1 and matching device 323 receiving a signal in the VHF band according to Embodiment 2. FIG. 17 is a Smith chart of antenna 1 and matching device 323 receiving a signal in the UHF band. In FIGS. 16 and 17, the upper half of each circle of the Smith chart represents an inductive impedance, and the lower half of each circle represents a capacitive impedance. In the portable receiver of Embodiment 2, output terminal 324 of matching device 323 is connected to electronic tuner 34 having an input impedance of about 75 Ω. Consequently, center 410 in FIGS. 16 and 17 corresponds to a resistive impedance of 75 Ω.

FIG. 16, line 401 represents the impedance of antenna 1 in the FM broadcast band and the VHF low band, and line 402 represents the impedance of antenna 1 in the VHF high band. Since antenna 1 has an electric length much shorter than ¼ wavelengths of signals to be received, resistance components 401 and 402 of the impedance are extremely small. Upon being connected directly to antenna 1, electronic tuner 34 having the input impedance of 75 Ω makes the signal attenuate due to impedance mismatch. Matching device 323 of Embodiment 2 includes capacitors 360 and 361 and inductors 362a, 362b, 365a, and 365b as impedance elements for matching so as to cause antenna 1 to match electronic tuner 34.

The matching requires the impedance at input terminal 322 of matching device 323 to be symmetrical to the impedance of antenna 1 with respect to line 404. First, as shown in FIG. 16, the inductance of inductor 362a is determined as to cause impedance 405 of matching device 323 in the VHF high band to match impedance 402 of antenna 1. Next, the inductance of inductor 362b is determined as to cause impedance 406 of matching device 323 in the VHF low band to match impedance 401 of antenna 1. Then, the capacitances of capacitors 360 and 361 and the inductances of inductors 365a and 365b are determined as to cause the impedance at output terminal 324 of matching device 323 to approach about 75 Ω (center 410 in FIG. 16) at frequencies in the VHF low band and the VHF high band.

Changes of the impedance of matching device 323 at the low end frequency in the FM broadcast band and the high end frequency in the VHF high band will be described below.

First, at the low end frequency in the FM broadcast band, inductor 362 has impedance 407 provided by an inductance of a combination of inductors 362a and 362b. Next, impedance 407 is changed into impedance 408 by capacitor 360, is then changed into impedance 409 by capacitor 360, and is further changed into impedance 411 near center 410, 75Q by capacitor 361.

When a signal in the VHF high band is received, inductor 362a is exclusively connected between input terminal 322 and the ground, so that inductor 362 has a smaller inductance than when a signal in the VHF low band is received. Consequently, at the high end frequency in the VHF high band, the impedance at input terminal 322 of matching device 323 becomes impedance 412 matching impedance 413 of antenna 1 at the high end frequency in the VHF high band. Then, impedance 412 is changed into impedance 414 by capacitor 360, is then changed into impedance 415 by inductor 365a, and is further changed into impedance 416 near center 410, 75 Ω by capacitor 361.

As described above, inductor 365 causes the impedance at output terminal 324 of matching device 323 to match the input impedance of electronic tuner 34 at frequencies in the FM broadcast band and the VHF low and high bands. This reduces signal loss for receiving TV broadcast signals.

An operation of matching device 323 receiving a signal in the UHF band will be described below with reference to FIG. 17. Line 420 represents the impedance of antenna 1 in the UHF band, and line 401 represents the impedance of antenna 1 at TV broadcast frequencies. Around the highest frequency in the UHF band (the high end frequency in the UHF band), antenna 1 has an electric length close to ¼ wavelength, thereby causing the impedance at input terminal 322 of matching device 323 to easily approach the impedance of antenna 1 beyond line 404. Around of the low end frequency in the UHF band, matching device 323 is formed exclusively of the capacitors shown in FIGS. 14 and 15, and have a small impedance, thereby reducing signal loss.

The aforementioned structure allows the impedance at input terminal 322 of matching device 323 in the VHF band to match the impedance of antenna 1, and also allows the impedance at output terminal 324 of matching device 323 in the VHF band to match the input impedance of electronic tuner 34. Thus, matching device 323 having a simple structure can transmit signals in each band to electronic tuner 34 without loss, thereby having a small size and being inexpensive.

According to Embodiment 2, in order to cause the impedance of antenna 1 to match the impedance of matching device 323, a resistance of antenna 1 is determined to be equal to the resistance component of the impedance of matching device 323, so that the impedances of antenna 1 and matching device 323 can be symmetrical to each other with respect to line 404.

The aforementioned structure allows matching device 323 to match antenna 1 having a length much shorter than ¼ wavelength of a high frequency signal to be received. Thus, the portable receiver according to Embodiment 2 can receive low frequency signals, such as signals in the FM broadcast band, with small antenna 1 for mobile-phone signals.

An operation of splitter 310 including matching device 323 of Embodiment 2 will be described below. When switches 364 and 367 are turned off, inductors 362 and 365 have capacitive impedances at frequencies of the mobile-phone signals. Consequently, inductor 315 and matching device 323 provides a low-pass filter. When switches 364 and 367 are turned on, inductor 365 having the capacitive impedance provides a low-pass filter at frequencies of the mobile-phone signals.

The inductances of inductor 315, inductor 362 (inductors 362a and 362b), and inductor 365 (inductor 365a and 365b) are determined appropriately so as to allow cutoff frequencies of the low-pass filters to be between the frequency range of mobile-phone signals and the frequency range of TV broadcast signals This prevents the mobile-phone signals from flowing to matching device 323, thereby allowing FM broadcast signals and TV broadcast signals to flow to matching device 323. Therefore, splitter 310 outputs FM broadcast signals and TV broadcast signals from output terminal 324.

In the aforementioned structure, since the impedance at input terminal 322 of matching device 323 is capacitive at frequencies of mobile-phone signals, matching device 323 and inductor 315 provides a low-pass filter. A cut-off frequency of this low-pass filter is determined to be between the frequency range of mobile-phone signals and the frequency range of TV broadcast signals. This arrangement causes impedance between terminals 311 and 324 of splitter 310 to be large at frequencies of mobile-phone signals and to be small at frequencies of FM broadcast signals and TV broadcast signals. Consequently, splitter 310 allows FM broadcast signals and TV broadcast signals to pass through the splitter to output terminal 324, and does not allow the mobile-phone signals to pass through.

The frequencies of TV broadcast signals are lower than those of the mobile-phone signals. Therefore, capacitor 313 has a large impedance at the frequencies of TV broadcast signals. Since matching device 323 causes antenna 1 to match electronic tuner 34 at frequencies of TV broadcast signals, the impedance at input terminal 322 of matching device 323 can be small at frequencies of FM broadcast signals and TV broadcast signals.

In the aforementioned structure, regardless of existence of FM broadcast signals and TV broadcast signals, and regardless of the frequency range, the mobile-phone signals received by antenna 1 are supplied to transmitting-receiving section 24 via input/output terminal 312, while mobile-phone signals input from transmitter 27 are supplied to antenna 1. TV broadcast signals are output from output terminal 324 even when the mobile-phone signals are transmitted and received.

Thus, splitter 310 separates the received signals into high frequency signals and low frequency signals, outputs these signals through the output terminals corresponding to the frequency ranges, and performs impedance matching between antenna 1 and tuner 34 at low frequencies. This provides a small, easy-to-carry portable receiver capable of receiving TV broadcast signals having long wavelengths and low frequencies only with short antenna 1 for receiving mobile-phone signals having short wavelengths and high frequencies.

At the frequencies of TV broadcast signals, the impedance at output terminal 324 of splitter 310 is smaller than the impedance at input/output terminal 312 of splitter 310. TV broadcast signals accordingly flow to matching device 323, and splitter 310 reduces loss of the TV broadcast signals. At the frequencies of mobile-phone signals, the impedance at input/output terminal 312 of splitter is smaller than the impedance at output terminal 324 of splitter 310. This prevents mobile-phone signals from flowing to matching device 323, thereby reducing loss of the mobile-phone signals in splitter 310.

Since capacitor 313 is exclusively connected between input/output terminals 311 and 312, the portable receiver according to Embodiment 2 can transmit and receive mobile-phone signals regardless of existence of TV broadcast signals.

When a signal in the VHF low band is received, splitter 310 cannot match antenna 1 in the VHF high band, thereby preventing a signal in the VHF high band from passing through splitter 310. When a signal in the VHF high band is received, splitter 310 cannot matched antenna 1 in the VHF low band, thereby preventing a signal in the VHF low band from passing through splitter 310. In other words, matching device 323 provided before low-pass filter 128 of electronic tuner 34 allows single-tuned filters 141 and 146 and double-tuned filters 143 and 148 not to have sharp attenuation characteristics. This can simplify these filters, make electronic tuner 34 inexpensive, and transmit signals received by antenna 1 to electronic tuner 34 without loss.

Since splitter 310 can matched antenna 1 having the length much shorter than ¼ wavelength, antenna 1 can have a small size, thereby providing a portable receiver which is carried easily.

Figure 18:
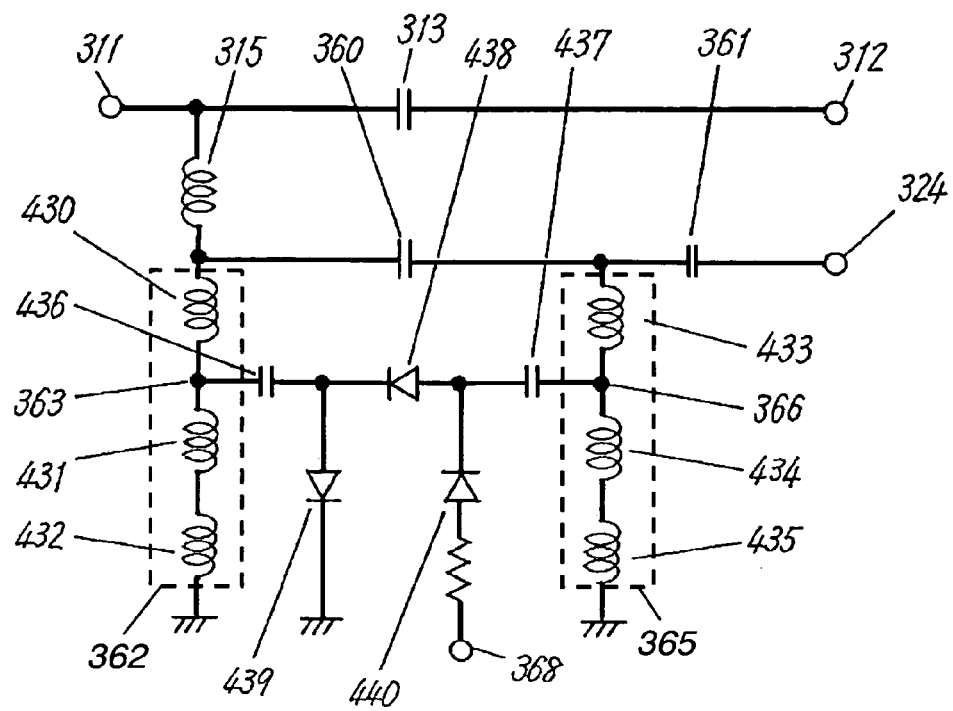
FIG. 18 is a circuit diagram of another matching device according to Embodiment 2.
Figure 19:
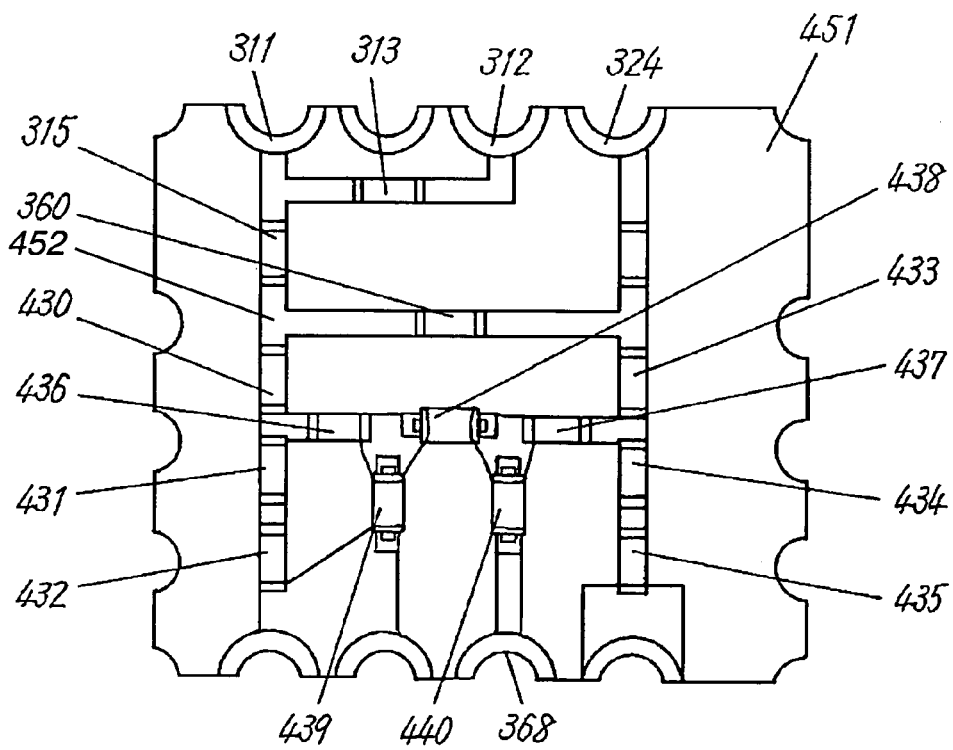
FIG. 19 is a top view of the matching device according to Embodiment 2.

FIG. 18 is a circuit diagram of splitter 310 shown in FIG. 10. FIG. 19 is a top view of splitter 310 for showing a component layout thereof. In FIGS. 18 and 19, the same components as those shown in FIGS. 1 and 10 will be denoted by the same reference numerals, and will be described just briefly.

In FIG. 18, inductor 362 is formed of an assembly including inductors 430, 431, and 432 connected in series with each other in this order from input/output terminal 311. Inductor 365 is formed of an assembly including inductors 433, 434, and 435 connected in series with each other.

Switches 364 and 367 are formed of diodes 438, 439, and 440. Capacitor 436, diode 438, and capacitor 437 are connected in series between node 363 connected to both of inductors 430 and 431 and node 366 connected to both of inductors 433 and 434. The cathode of diode 438 is connected to the anode of diode 439, and the cathode of diode 439 is connected to the ground. The anode of diode 438 is connected to the cathode of diode 440, and the anode of diode 440 is connected to control terminal 368 via a resistor.

Capacitors 436 and 437 prevent a direct-current, a control signal, from flowing to the input/output terminal, the input terminal, and the output terminal. Diode 438 prevents a high frequency signal from flowing between nodes 363 and 366 when diode 439 is turned off. Diode 440 prevents a high frequency signal from flowing from control terminal 368. When a signal in the VHF high band is received, a voltage of, e.g. 5V is supplied to control terminal 368 to turn on diodes 438, 439, and 440. When a signal in the VHF low band is received, the voltage of control terminal 368 is set to 0 V to turn off diodes 438, 439, and 440.

FIG. 19 is a top view of splitter 310 (matching device) according to Embodiment 2. As shown in FIG. 19, the circuit shown in FIG. 18 is formed of chip components. The chip components are reflow-soldered to conductor 452, and soldered onto double-sided printed board 451. Input/output terminals 311 and 312, output terminal 324, control terminal 368, and a ground terminal are provided by through-hole terminals. Splitter 310 includes a cover (not illustrated). The cover has a leg soldered to the ground terminal as to shield splitter 310.

The impedance of inductor 430 is originally capacitive in the UHF band, as shown in Table 3; however, the impedance is inductive according to Embodiment 2. Having been selected optimum inductances for the VHF low band and the VHF high band, impedance of inductance 430 itself is inductive in the UHF band.

More specifically, a self resonant frequency of inductor 430 is in the UHF band. A small inductor provided by conductor 452 on board 451 is connected via soldering to inductors 430 and 430. This arrangement causes a resonant frequency of a combined inductor formed of inductor 430 and conductor 452 to be lower than that of inductor 430 alone, and the combined inductor has a capacitive impedance in the UHF band. The small inductor provided by conductor 452 is small enough not to influence the circuit at frequencies in the VHF band.

As described above, the inductors cannot always have the inductances satisfying all requirements. If the inductors do not have such inductances, the inductances of the inductors are determined to be inductive at frequencies in the VHF band, and are optimized for the matching at frequencies in both the VHF high band and the VHF low band. Under these conditions, if the impedance of inductor 430 is inductive in the UHF band, conductor 452 is designed appropriately as to cause the combined inductor of inductor 430 and conductor 452 to have a capacitive impedance.

Consequently, even when the impedances of the actual inductors are not capacitive at UHF-band frequencies, capacitive impedances can be easily obtained in the UHF band. Thus, the values of the inductors can be determined within a wide range.

The inductors are soldered onto the conductor at their respective positions precisely because of self alignment effect of reflow soldering. Consequently, the value of a small inductor provided by conductor 452 is substantially constant so that the self resonant frequency of inductor 430 can be stable, thereby stabilizing quality of splitter 310.

According to Embodiment 2, electronic tuner 34 and FM tuner 309 are connected to output terminal 324. FM tuner 309 may be exclusively connected to output terminal 324. In this case, switches 364 and 367 are not necessary. In such case, the inductance of inductor 315 is determined appropriately as to determine a cut-off frequency of the low-pass filter provided by inductors 315 and 362 having the capacitive inductance in the UHF band to be close to the low end frequency in the UHF band. This causes signals of frequencies higher than the UHF band to attenuate, and accordingly, prevents the signals from flowing to FM tuner 309. Then, FM tuner 309 does not affected by interference caused by UHF broadcast signals and mobile-phone signals.

According to Embodiment 2, electronic tuner 34 and FM tuner 309 are connected to output terminal 324. FM tuner 309 may be exclusively connected to output terminal 324. In this case, switches 364 and 367 are not necessary. In such case, the inductance of inductor 315 is determined appropriately as to determine a cut-off frequency of the low-pass filter provided by inductors 315 and 362 having the capacitive inductance in the UHF band to be close to the low end frequency in the UHF band. This causes signals of frequencies higher than the UHF band to attenuate, and accordingly, prevents the signals from flowing to FM tuner 317. Then, FM tuner 309 does not affected by interference caused by UHF broadcast signals and mobile-phone signals.

In this case, UHF broadcast signals and mobile-phone signals hardly flow to FM tuner 309, so that low-pass filter 320 does not need to have sharp attenuation characteristics. Therefore, low-pass filter 320 can be either eliminated or replaced by a trap reducing signals in the VHF high band, thereby reducing the loss of FM broadcast signals. This provides a portable receiver capable of receiving FM broadcasts sensitively.

In this case, inductors 315, 362, and 365 have inductances of about 33 nF, about 120 nF, and about 68 nF, respectively. Capacitor 360 has a capacitance of about 22 pF and capacitor 361 has a capacitance of about 27 pF.

Exemplary Embodiment 3

Figure 20:
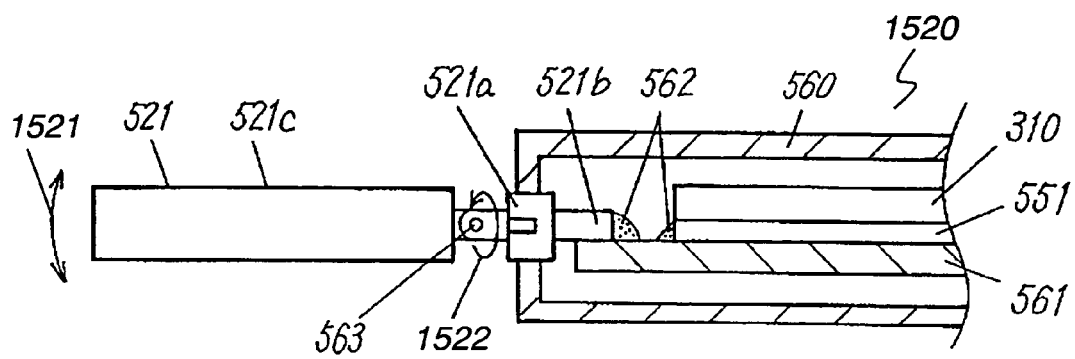
FIG. 20 is a cross sectional view of an essential portion of a portable receiver according to Exemplary Embodiment 3 of the invention.

FIG. 20 is a cross sectional view of receiver 1520 according to exemplary Embodiment 3 of the present invention. Receiver 1520 includes splitter 310 shown in FIG. 10 according to Embodiment 2.

Antenna 521 has at its end mounter 521a fixed at case 560 made of insulating material, such as resin. Tip portion 521b of mounter 521a is connected by either solder 562 or a screw to a conductor on printed circuit board 561 accommodated in case 560.

Antenna 521 has moving portion 563 between main body 521c and mounter 521a. Moving portion 563 is rotatably in two directions 1521 and 1522 supported by mounter 521a. Splitter 310 is mounted on printed circuit board 561, and antenna 521 is electrically connected to input/output terminal 311 with each other by solder 562.

In receiver 1520 having the above structure, in order to compensate a decrease of receiver sensitivity due to the directivity of antenna 521, moving portion 563 is moved so as to locate antenna 521 at a position to obtain optimum receiver sensitivity. In receiver 1520 according to Embodiment 3, a contact resistance in moving portion 563 causes antenna 521 to have a minor resistance at high frequencies. An impedance provided by the resistance is determined to be substantially equal to the resistance component of matching device 323 of splitter 310, and accordingly, splitter 310 can easily match antenna 521 having an extremely small impedance.

The matching devices according to Embodiments 1 and 2 can simplify the splitters and reduce the sizes of the splitters, thereby reducing the size of receiver 1520. Furthermore, the impedance provided by the resistance in moving portion 563 is determined to be substantially equal to the resistance component of the impedance of matching device 323, antenna 521 having an electric length much smaller than ¼ wavelengths of frequencies to be received can match electronic tuner 34 in a wide range.

Exemplary Embodiment 4

Figure 21:
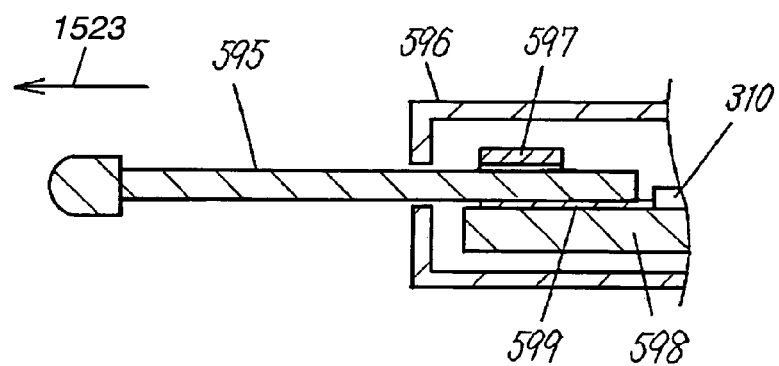
FIG. 21 is a cross sectional view of an essential portion of a portable receiver according to Exemplary Embodiment 4 of the invention.
Figure 22:
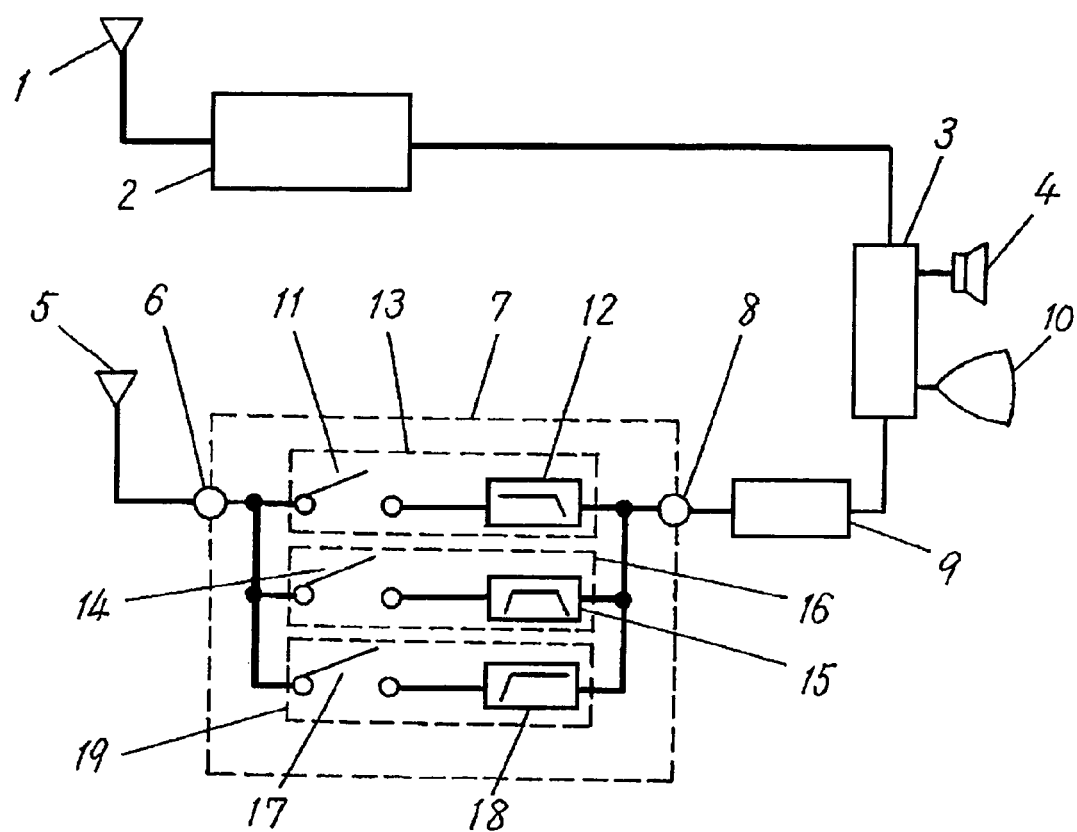
FIG. 22 is a block diagram of a conventional portable receiver.

FIG. 21 is a cross sectional view of an essential portion of portable receiver 596 according to Exemplary Embodiment 4 of the present invention. Receiver 596 includes splitter 310 shown in FIG. 10 according to Embodiment 2. In FIG. 21, the same components as those of Embodiment 3 are denoted by the same reference numerals, and will be described just briefly.

Antenna main body 595 is mounted on the upper end of portable receiver 596, and is connected via sliding portion 597 to printed circuit board 598 in portable receiver 596. Antenna main body 596 and sliding portion 597 correspond to antenna 521 of Embodiment 3.

Sliding portion 597 is made of metal so as to transmit signals, and is extendable in direction 1523. Sliding portion 597 is connected to splitter 310 including matching device 323 via pattern 599 formed on printed circuit board 598.

Since being electrically connected by contact, sliding portion 597 has a small contact resistance. This resistance allows the output impedance to easily match a target impedance by matching device 323 formed of reactance elements, thereby providing a portable receiver having small loss.

Splitter 310 including matching device 323 enables antenna main body 595 to have a length much shorter than the wavelengths of signals to be received, thereby reducing the size of portable receiver 596.

According to Embodiment 4, the small resistance is the contact resistance of sliding portion 597 itself. This small resistance may be provided by a chip resistor additionally provided between antenna main body 595 and splitter 310. In this case, the added chip resistor can prevents sliding part 597 from contributing to the small resistance, thereby providing a resistance stable for any condition of antenna main body 595. This allows portable receiver 596 to stably receive signals regardless of the position of antenna main body 595.

The chip resistor may be mounted on printed circuit board 598 similarly to matching device 323. Since the chip resistor can be mounted simultaneously to matching device 323, portable receiver 956 can be manufactured inexpensively at high productivity. If the chip resistor is mounted at antenna main body 595, printed circuit board 598 allows antenna main body 595 to match splitter 310 easily.

INDUSTRIAL APPLICABILITY

A receiver including a matching device according to the present invention and receiving signals in plural frequency ranges can receive low-frequency signals with a small antenna, thus having a small size and being carried easily.

The invention claimed is:

1. A matching device for allowing an antenna to match a receiving section arranged to receive a signal in a first frequency band and a signal in a second frequency band lower than the first frequency band, said matching device comprising:
   a first terminal arranged to be connected to the antenna;
   a first inductor connected between the first terminal and a first node;
   a second inductor connected between the first node and a ground, the second inductor having a capacitive impedance in the first frequency band and having an inductive impedance in the second frequency band;
   a first capacitor connected between the first node and a second node;
   a second terminal connected to the second node, the second terminal being arranged to be connected to the receiving section; and
   a third inductor connected between the second node and the ground.

2. The matching device according to claim 1, further comprising an amplifier connected between the second node and the second terminal.

3. The matching device according to claim 1, further comprising:
   a first diode connected between the first node and the ground; and
   a second diode connected between the first node and the ground, the second diode being connected in parallel to the first diode in a polarity reverse to a polarity of the first diode.

4. The matching device according to claim 1 further comprising a selector for changing an inductance of the second inductor.

5. The matching device according to claim 4,
   wherein the second inductor comprises a fourth inductor and a fifth inductor connected in series with the fourth inductor, and
   wherein the selector opens and short-circuits between the ground and a node provided between the fourth inductor and the fifth inductor so as to change the inductance of the second inductor.

6. The matching device according to claim 5, wherein the fifth inductor comprises a sixth inductor and a seventh inductor connected in series with the fifth inductor.

7. The matching device according to claim 5, further comprising:
   a board having the first inductor, the second inductor, the third inductor, and the fourth inductor mounted thereon; and
   a conductor provided on the board so as to connect the fourth inductor with the fifth inductor.

8. The matching device according to claim 7, wherein the fourth inductor, the conductor, and the fifth inductor are reflow soldered.

9. The matching device according to claim 7, wherein the fourth inductor and the conductor provides a combined capacitive impedance at the first frequency band.

10. The matching device according to claim 4,
    wherein the second frequency band comprises a third frequency band and a fourth frequency band lower than the third frequency band, and
    wherein the selector changes the inductance of the second inductor between a case that the receiving section receives a signal in the third frequency band and a case that the receiving section receives a signal in the fourth frequency band.

11. The matching device according to claim 10, wherein, when the receiving section receives the signal in the third frequency band, the second inductor has a self resonant frequency between a highest frequency in the third frequency band and a lowest frequency in the first frequency band.

12. The matching device according to claim 10, wherein, when the receiving section receives the signal in the fourth frequency band, the second inductor has a self resonant frequency between a highest frequency in the fourth frequency band and a lowest frequency in the first frequency band.

13. The matching device according to claim 10, wherein the third frequency band comprises a VHF high band, and the fourth frequency band comprises a VHF low band.

14. The matching device according to claim 1, further comprising a selector for changing an inductance of the third inductor.

15. The matching device according to claim 14,
    wherein the third inductor comprises a fourth inductor and a fifth inductor connected in series with the fourth inductor, and
    wherein the selector opens and short-circuits between the ground and a node provided between the fourth inductor and the fifth inductor as to change the inductance of the third inductor.

16. The matching device according to claim 1, further comprising a second capacitor connected in series with the third inductor and between the second node and the ground.

17. The matching device according to claim 16, wherein a resonant frequency determined by the third inductor and the second capacitor is higher than frequencies in the first frequency band.

18. The matching device according to claim 1, wherein the first frequency band comprises a UHF band.

19. The matching device according to claim 1, wherein an impedance at the first terminal of the antenna to be connected to the first terminal in the first frequency band is substantially equal to an impedance at the second terminal of the receiving section to be connected to the second terminal in the first frequency band.

20. The matching device according to claim 19, wherein, in the third frequency band, the first inductor, and the second inductor provide a low-pass filter having a cut-off frequency lower than a lowest frequency in the third frequency band.

21. The matching device according to claim 1, wherein the first frequency band comprises a third frequency band and a fourth frequency band lower than the third frequency band, said matching device further comprising:
    a third terminal arranged to be connected to a communication device for receiving a signal in the third frequency band; and
    a second capacitor connected between the first terminal and the third terminal.

22. The matching device according to claim 21, further comprising a board having a top surface and a side surface, the board having the first inductor, the second inductor, the third inductor, and the first capacitor mounted on the top surface of the board, wherein the first terminal and the third terminal are provided on the side surface of the board.

23. The matching device according to claim 22, further comprising a ground terminal connected to the ground, the ground terminal being provided on the side surface and between the first terminal and the third terminal.

24. The matching device according to claim 21, further comprising a third capacitor connected in series with the third inductor and between the second node and the ground.

25. The matching device according to claim 24, wherein a resonant frequency determined by the third inductor and the third capacitor is substantially equal to a center frequency in the fourth frequency band.

26. A receiver comprising:
    an antenna;
    a receiving section arranged to receive a signal in a first frequency band and a signal in a second frequency band lower than the first frequency band; and
    an audio output unit to which an output of the receiving section is supplied;
    a matching device including
      a first terminal connected to the antenna,
      a first inductor connected between the first terminal and a first node,
      a second inductor connected between the first node and a ground, the second inductor having a capacitive impedance in the first frequency band and having an inductive impedance in the second frequency band, a first capacitor connected between the first node and a second node, a second terminal connected to the second node and the receiving section, and a third inductor connected between the second node and the ground.

27. The receiver according to claim 26, wherein the antenna has a length not larger than ¼ wavelength of the second frequency band, and wherein the antenna has a resistance substantially equal to a resistance component of an impedance at the first terminal of the matching device.

28. The receiver according to claim 26, wherein the antenna includes an antenna main body, and a moving portion provided between the antenna main body and the first terminal of the matching device so as to make the antenna main body movable, the moving portion having a resistance.

29. The receiver according to claim 28, wherein the resistance of the moving portion is substantially equal to a resistance component of an impedance at the first terminal of the matching device.

30. The receiver according to claim 26, wherein the antenna includes an antenna main body, and a sliding portion connected between the antenna main body and the first terminal of the matching device so as to make the antenna main body slidable, the sliding portion having a resistance.

31. The receiver according to claim 30, wherein the resistance of the sliding portion is substantially equal to a resistance component of an impedance at the first terminal of the matching device.

32. A receiver comprising:

an antenna;

a first receiving section arranged to receive a signal in a first frequency band;

a second receiving section arranged to receive a signal in a second frequency band lower than the first frequency band, and to receive a signal in a third frequency band lower than the second frequency band;

an audio output unit to which outputs of the first receiving section and the second receiving section are supplied; and a matching device including a first terminal connected to the antenna, a first inductor connected between the first terminal and a first node, a second inductor connected between the first node and a ground, the second inductor having a capacitive impedance in the first frequency band and the second frequency band, the second inductor having an inductive impedance in the third frequency band, a first capacitor connected between the first node and a second node, a second terminal connected to the second node and the second receiving section, a third inductor connected between the second node and the ground, a third terminal connected to the first receiving section, and a second capacitor connected between the first terminal and the third terminal.

33. The receiver according to claim 32, wherein the antenna has a length not larger than ¼ wavelength of the first frequency band, and wherein the antenna has a resistance substantially equal to a resistance component of an impedance at the first terminal of the matching device.

* * * * *